United States Patent
Mizokawa et al.

(10) Patent No.: US 8,348,584 B2
(45) Date of Patent: Jan. 8, 2013

(54) CONVEYER SYSTEM

(75) Inventors: Takumi Mizokawa, Tokyo (JP);
Mitsutoshi Ochiai, Toyohashi (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 597 days.

(21) Appl. No.: 12/513,373

(22) PCT Filed: Nov. 6, 2007

(86) PCT No.: PCT/JP2007/071871
§ 371 (c)(1),
(2), (4) Date: May 22, 2009

(87) PCT Pub. No.: WO2008/056805
PCT Pub. Date: May 15, 2008

(65) Prior Publication Data
US 2010/0068013 A1 Mar. 18, 2010

(30) Foreign Application Priority Data

Nov. 7, 2006 (JP) ................................. 2006-301078
Feb. 26, 2007 (JP) ................................. 2007-046122
Jun. 1, 2007 (JP) ................................. 2007-146652

(51) Int. Cl.
*B65H 1/00* (2006.01)

(52) U.S. Cl. ..................... 414/225.01; 414/281; 414/940

(58) Field of Classification Search ............. 414/225.01, 414/281, 940
See application file for complete search history.

(56) References Cited

U.S. PATENT DOCUMENTS

| 6,283,692 | B1 | 9/2001 | Perlov et al. |
| 6,364,593 | B1 | 4/2002 | Hofmeister et al. |
| 6,799,932 | B2 * | 10/2004 | Davis et al. ................. 414/217.1 |
| 6,896,470 | B1 * | 5/2005 | Chen et al. ...................... 414/411 |
| 7,134,826 | B2 * | 11/2006 | Mitsuyoshi .............. 414/222.01 |
| 7,578,650 | B2 * | 8/2009 | Aalund et al. ................. 414/806 |
| 7,704,031 | B2 * | 4/2010 | Mitsuyoshi ................... 414/217 |
| 7,887,276 | B2 * | 2/2011 | Natume ........................ 414/217 |
| 2002/0025244 | A1 | 2/2002 | Kim et al. |
| 2003/0156928 | A1 * | 8/2003 | Sackett et al. ................ 414/217 |

FOREIGN PATENT DOCUMENTS

| JP | 2001 53129 | 2/2001 |
| JP | 2002 246432 | 8/2002 |
| JP | 2002 531941 | 9/2002 |
| JP | 2003 86653 | 3/2003 |
| JP | 2003 318244 | 11/2003 |

OTHER PUBLICATIONS

European Search Report issued Dec. 8, 2011 in PCT/JP2007/071871 filed Nov. 6, 2007.

* cited by examiner

*Primary Examiner* — Scott Lowe
(74) *Attorney, Agent, or Firm* — Oblon, Spivak, McClelland, Maier & Neustadt, L.L.P.

(57) ABSTRACT

An OHT conveyer vehicle places a FOUP on first and second on platforms. A third platform can move to a position overlapping with the first and second platform by a moving device, and then to a position at which an upper surface of the third platform is above upper surfaces of the first and second platforms by an elevation device. Therefore, the FOUP is placed on the third platform. Subsequently, the third platform can move to a position overlapping with fourth and fifth platforms by the moving device, and then to a position at which the third platform is lower than the fourth and fifth platforms by the elevation device. Therefore, the FOUP is placed on the fourth and fifth platforms.

9 Claims, 22 Drawing Sheets

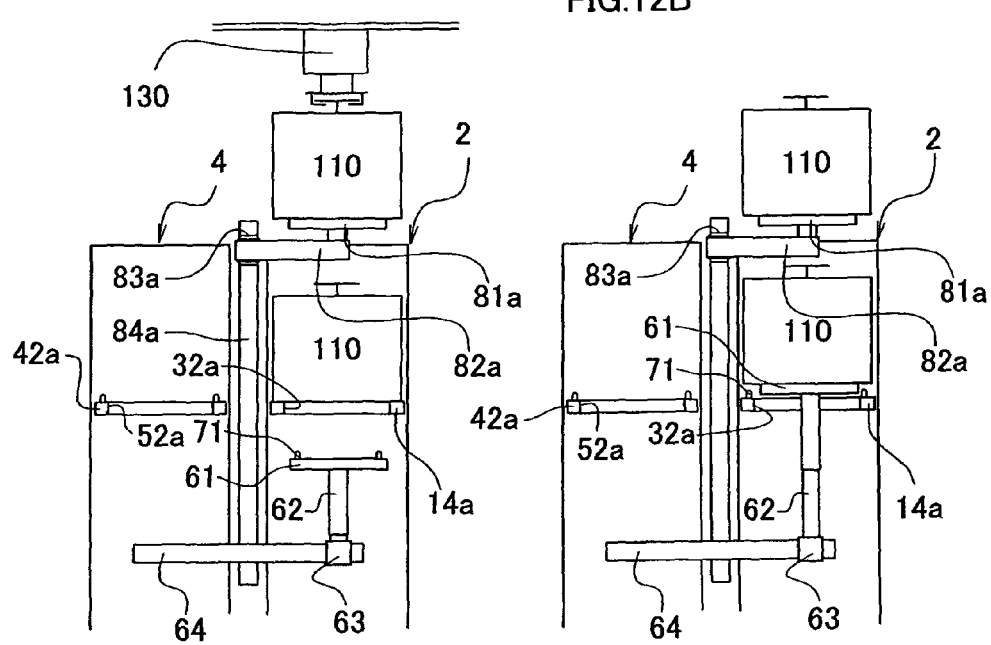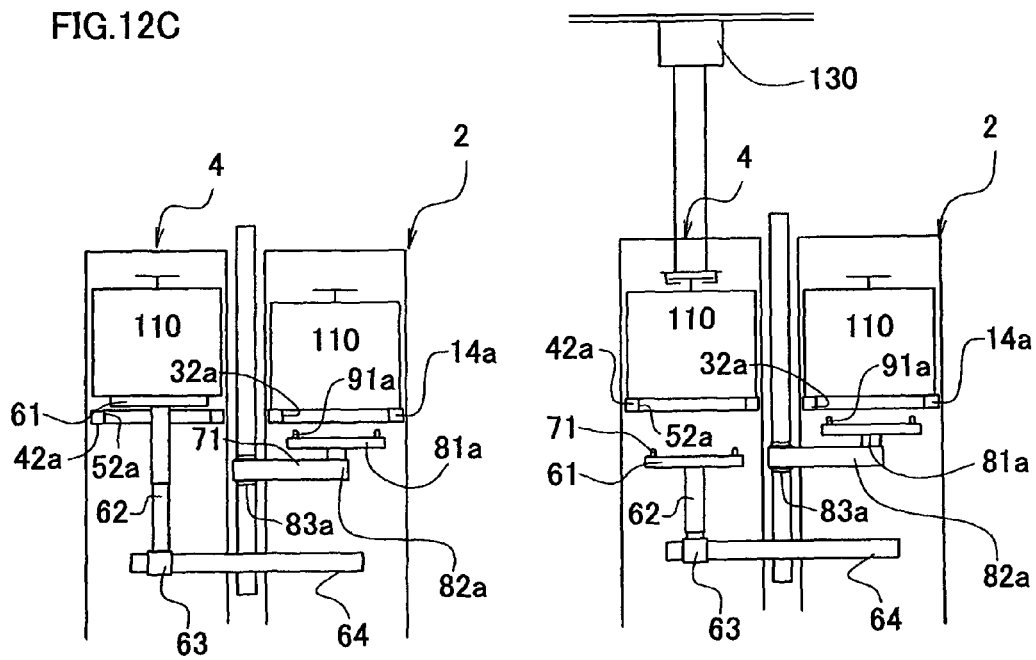

CONVEYER SYSTEM

TECHNICAL FIELD

This invention relates to a conveyer system for conveying a carrier to a load port.

BACKGROUND ART

Semiconductor production devices performing process steps for producing semiconductors are disposed inside a isolated space that is isolated from the outside and remarkably reduced in dust for the purpose of preventing adhesion of dust to a semiconductor substrate. In order to prevent the dust adhesion to semiconductor substrate, the semiconductor substrate is conveyed between the semiconductor production devices by an OHT conveyer vehicle in a state where the semiconductor substrate is housed in a carrier such as a FOUP that has a housing space for housing the semiconductor substrate in its internal part. A load port capable of providing communication between the isolated space and the outside is provided on a wall defining the isolated space, and the semiconductor substrate is delivered between the FOUP and the semiconductor production devices by the load port when the housing space and the isolated space are connected to each other.

In a semiconductor production device, i.e. semiconductor production unit, disclosed in JP-A-2003-318244, two load ports are disposed adjacent to each other on a wall defining a chamber, i.e. isolated space. When a FOUP is connected to the load port, a conveyer robot delivers a semiconductor substrate between the FOUP and an alignment unit, i.e. semiconductor production device, disposed inside the chamber. With the provision of the two load ports for one isolated space, the FOUP is placed on one of the load ports during processing on the FOUP placed on the other load port by the semiconductor device, and processing on the semiconductor substrate of the FOUP placed on one of the load ports is performed immediately after completion of the processing on the semiconductor substrate of the FOUP placed on the other load port, thereby improving a use efficiency of the semiconductor production devices.

DISCLOSURE OF THE INVENTION

It is possible to house up to about 25 semiconductor substrates in one FOUP, for example, and there is a tendency in recent years that each of various semiconductors is produced in a small number. Along with this, a FOUP actually houses not more than a several semiconductor substrates in many cases. Accordingly, time spent for processing on the semiconductor substrates housed in one FOUP by a semiconductor production device is reduced. Therefore, conveying frequency of the FOUP is increased to increase time between the completion of processing on semiconductor substrates housed in one FOUP by a semiconductor production device and the start of processing on the semiconductor substrates housed in the next FOUP even with the structure of providing the two load ports for one semiconductor production device. As a result, use efficiency of the semiconductor production device is degraded. It is possible to maintain a high semiconductor production device use efficiency by increasing the number of load ports for one isolated space in JP-A-2003-318244. However, in this case, it is necessary to increase the number of conveyer robots with an increasing number of load ports or to move the conveyer robots along the plural load ports. With such constitution, a space in which the conveyer robots are disposed, i.e. the isolated space, is increased in size to allow contaminants to easily enter the isolated space.

An object of this invention is to provide a conveyer system capable of improving a use efficiency of semiconductor production device without increasing the number of load ports.

A conveyer system of this invention includes a load port and a first conveyor device. The load port has a first platform on whose upper surface a carrier for conveying a semiconductor substrate is placed. The load port is provided for communication between an isolated space and a housing space. The isolated space is isolated from outside. In the isolated space, a semiconductor production device performing processing for semiconductor production on the semiconductor substrate is disposed. The housing space is provided inside the carrier placed on the first platform. The housing space houses the semiconductor substrate. The first conveyer device is for conveying the carrier between the first platform and a predetermined first position. The first position is adjacent to the first platform with respect to a horizontal direction. The first platform has a first notch extending from one lateral surface to an inside of the first platform. The first conveyer device includes a second platform and a first moving unit. On the upper surface of the second platform, the carrier is to be placed. The first moving unit is for moving the second platform in a vertical direction, and in the horizontal direction between the first platform and the first position. The second platform is movable in the vertical direction as passing through an inner part of the first notch.

With such constitution, by repeating an operation of placing the carrier on the second platform at the first position by the OHT conveyer vehicle when the carrier is placed on the first platform and then transferring the carrier from the second platform to the first platform by the first conveyer device, the carriers are successively placed on the first platform. Therefore, time between processing on semiconductor substrates housed in one carrier by a semiconductor production device and processing on semiconductor substrates housed in a subsequent carrier is reduced to improve a use efficiency of the semiconductor production device.

Also, since the first conveyer device is provided independently from the OHT conveyer vehicle for conveying the carriers to the load port, it is possible to efficiently convey the carriers.

Also, by providing the first conveyer device in place of adding a load port, a distance of movement of a robot for delivering the semiconductor substrate between the semiconductor production device disposed at an opposite side of the first platform of the load port and the carrier is reduced. Therefore, it is possible to efficiently deliver the semiconductor substrate between the carrier and the semiconductor production device.

The conveyer system according to this invention may further include a relay unit disposed adjacent to the first platform and having a third platform on whose upper surface the carrier is temporarily placed on the first position. The first conveyer device conveys the carrier between the first platform and the third platform. The third platform has a second notch extending from a lateral surface facing to the first platform to an inside of the third platform. And the second platform is movable in the vertical direction as passing through an inner part of the second notch.

With such constitution, it is possible to place the carrier on the third platform from the OHT conveyer vehicle even when the second platform does not reach the first position, thereby making it possible to efficiently convey the carrier.

Also, in the case of increasing the number of load port in place of providing the relay unit, delivery of the semiconductor substrate is performed between the carrier and the semiconductor production device in the added load port. Therefore, it is necessary to provide a mechanism for providing communication between the isolated space and the housing space at a part of the added load port that is opposite to the first platform as well as to use the space in which the mechanism is placed as the isolated space. However, it is unnecessary to provide such mechanism on the part of the relay unit that is opposite to the third platform in this invention. Therefore, it is possible to reduce the size of the isolated space without using the part of the relay unit that is opposite to the third platform as the isolated space, thereby making it possible to prevent contaminants such as dust from entering the isolated space. Alternatively, in the case of using a space at the rear of the relay unit as the isolated space, it is possible to dispose the semiconductor production device in the space, thereby making it possible to efficiently use the space.

In the conveyer system of this invention, the relay unit may include the first conveyer device. With such constitution, since the relay unit has the first conveyer device, by disposing the relay unit adjacent to the load port, it is unnecessary to separately perform a step for attaching the first conveyer device, and it is possible to easily structure the conveyer system. Further, the load port is obtainable by replacing a platform of a conventional load port with the first platform, and conventional parts may be used as they are for other parts.

In the conveyer system of this invention, the first platform, the second platform, and the third platform may have a positioning unit for positioning the carrier. With such constitution, it is possible to place the carrier to a predetermined position of the first to the third platforms.

In the conveyer system of this invention, the second platform may further include a first fixing unit for fixing the carrier placed on the second platform. With such constitution, it is possible to prevent the carrier from falling out from the second platform and from being taken away from the second platform by a user by mistake.

The conveyer system of this invention may further include a plurality of identification units for identifying a type of the carrier placed on the first platform. The plurality of identification units include a first identification unit provided on the first platform and a second identification unit provided with the second platform, and the first identification unit and the second identification unit may be disposed at positions corresponding to a predetermined standard and enabling to identify the type of the carrier placed on the first platform in a state where the second platform overlaps with the first notch and is at a height identical with that of the first platform.

In the load port, it is required to dispose the plurality of identification units for identifying the type of the carrier placed on the first platform on the position decided in accordance with the predetermined standard, and it is sometimes impossible to dispose all the identification units on the first platform when the notch is formed at a part of the first platform. However, according to this invention, by disposing the identification units that cannot be placed on the first platform on the second platform, it is possible to dispose the plurality of identification units at the positions decided in accordance with the predetermined standard.

Also, in the conveyer system according to this invention, the first platform may be provided with a judgment unit for judging whether or not the carrier is placed on the first platform. Though it is possible to judge whether or not the carrier is placed on the first platform by so disposing the second platform as to overlap with the notch and as to be at the same height with the first platform in the case where the judgment unit is provided on the second platform, it is impossible to judge whether or not the carrier is placed on the first platform when the second platform moves to another position. However, according to this invention, since the judgment unit is provided on the first platform, it is possible to judge whether or not the carrier is placed on the first platform irrespective of the position of the second platform.

The conveyer system according to this invention may further include a second conveyer device for conveying the carrier between the first platform and a predetermined second position that is above the first platform. The second conveyer device includes a fourth platform having a shape substantially identical with that of the second platform and a second moving unit for moving the fourth platform in the vertical direction.

With such constitution, after placing the carrier, which is to be subsequently placed on the first platform, on the fourth platform at the second position by the OHT conveyer vehicle in a state where the carrier is placed on the first platform, the carrier placed on the first platform is transferred to the second platform by the first conveyer unit to move the carrier to the first position, and the carrier placed on the fourth platform is transferred to the first platform by the second conveyer unit, thereby replacing the carriers placed on the first platform. Further, from this state, after conveying the carrier conveyed to the first position to the next process step and placing the carrier, which is to be subsequently placed on the first platform, on the second platform at the first position by the OHT conveyer vehicle, the carrier placed on the first platform is transferred to the fourth platform and conveyed to the second position by the second conveyer device, and the carrier placed on the second platform is conveyed to the first platform by the first conveyer device to transfer the carrier to the first platform, thereby replacing the carriers placed on the first platform.

By repeating the above-described operation, it is possible to perform the operation of replacing the carriers placed on the first platform independently from the operation of the OHT conveyer vehicle. Therefore, it is possible to perform processing on the semiconductor substrate housed in the next carrier immediately after the processing on the semiconductor substrate housed in the carrier placed on the first platform is completed, thereby improving a use efficiency of the semiconductor production device.

In the conveyer system of this invention, the fourth platform may further include a second fixing unit for fixing the carrier placed on the fourth platform. With such constitution, it is possible to prevent the carrier from falling out from the fourth platform and from being taken away from the fourth platform by a user by mistake.

The conveyer system according to this invention may further include a third conveyer device for conveying a carrier between the first platform and the first position, the third conveyer device being different from the first conveyer device. The third conveyer device includes a carrier gripping unit capable of suspending the carrier by gripping an upper end of the carrier and a third moving unit for moving the carrier gripping unit in the vertical direction, and in the horizontal direction between the first platform and the first position.

With such constitution, by conveying the carrier from one of the first platform and the first position to the other by the first conveyer device and conveying the carrier from the other to the one by the third conveyer device, it is possible to easily replace the carriers placed on the first platform.

BRIEF DESCRIPTION OF THE DRAWINGS

FIG. 12A is a diagram showing a step of a procedure of replacing FOUPs in the second embodiment.

FIG. 12B is a diagram showing a step of a procedure of replacing FOUPs in the second embodiment next to the step of FIG. 12A.

FIG. 12C is a diagram showing a step of a procedure of replacing FOUPs in the second embodiment next to the step of FIG. 12B.

FIG. 12D is a diagram showing a step of a procedure of replacing FOUPs in the second embodiment next to the step of FIG. 12C.

BEST MODE FOR CARRYING OUT THE INVENTION

Hereinafter, preferred embodiments of this invention will be described with reference to the drawings.

First Embodiment

Figure 1:
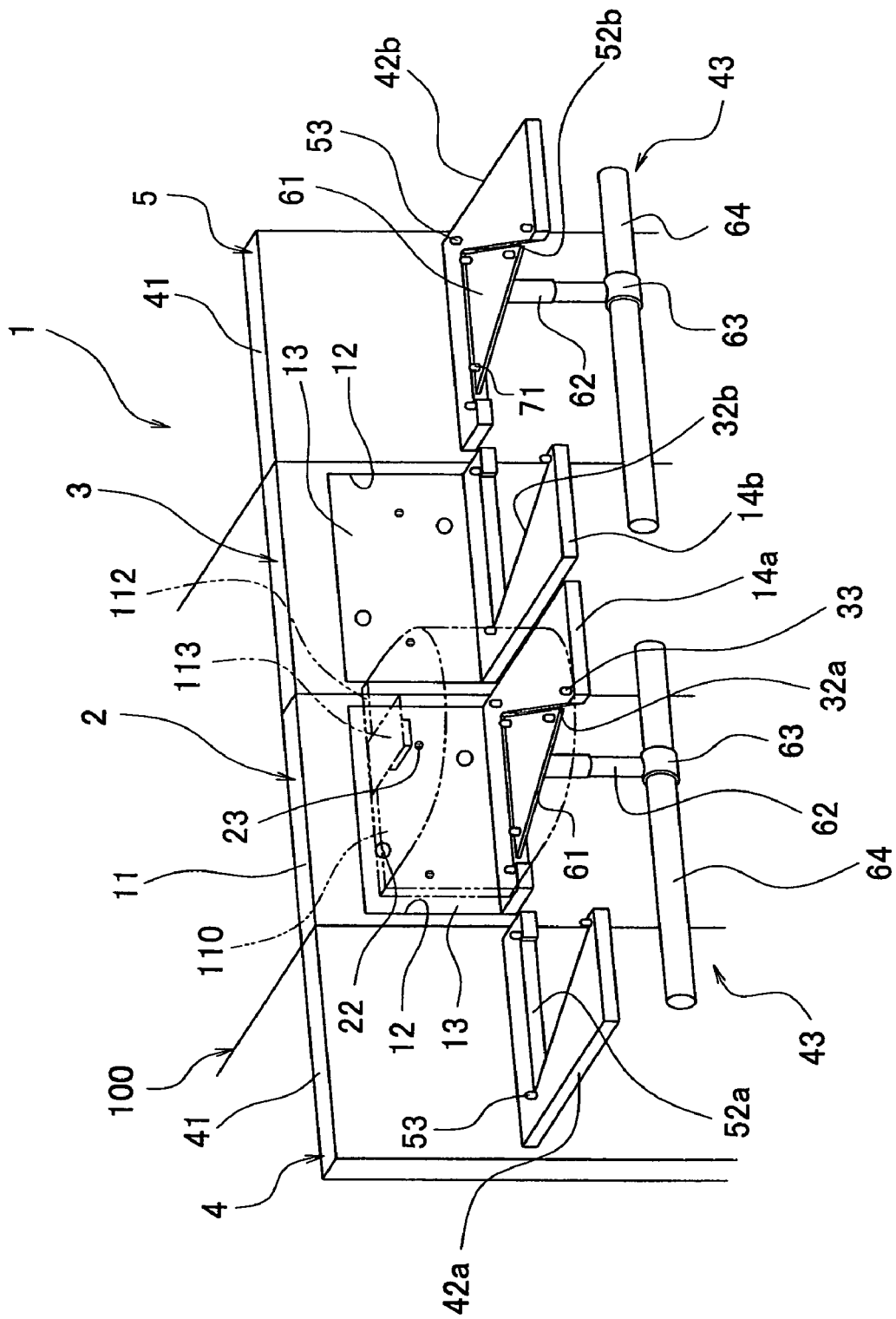
FIG. 1 is a schematic perspective view showing a conveyer system according to the first embodiment of this invention.

FIG. 1 is a schematic perspective view showing a conveyer system according to the first embodiment of this invention. As shown in FIG. 1, a conveyer system 1 has two load ports 2 and 3 and two relay units 4 and 5.

Figure 2:
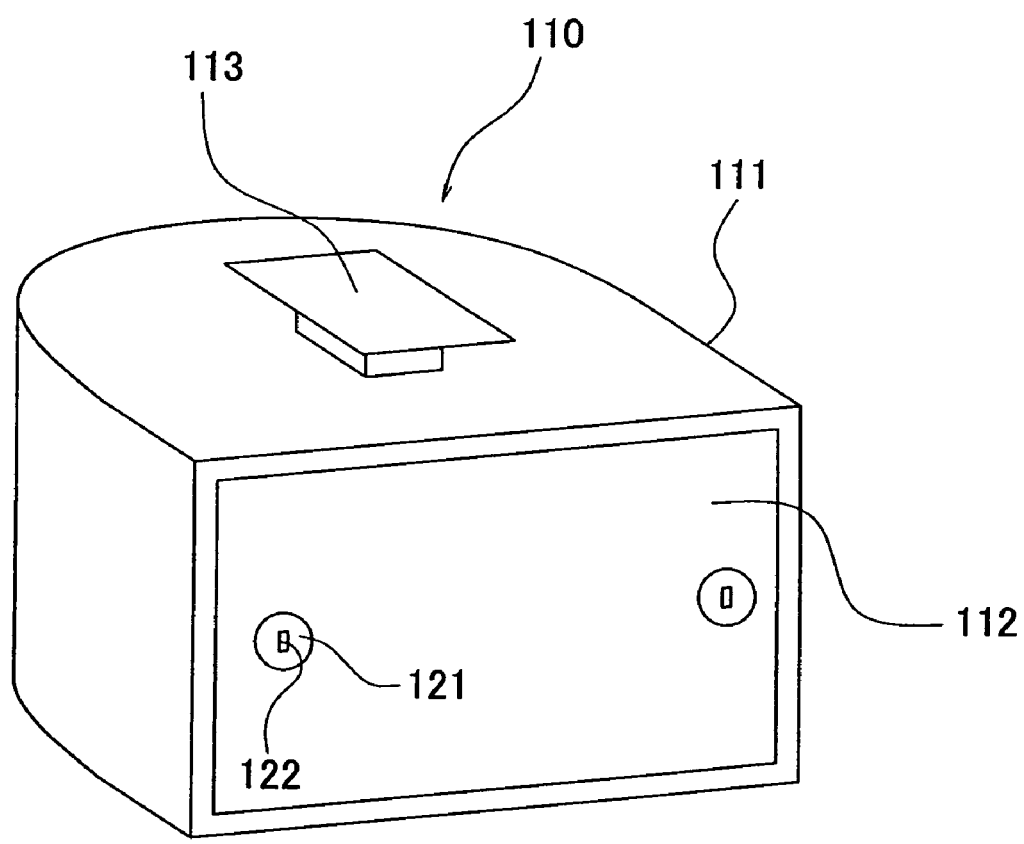
FIG. 2 is a schematic perspective view showing a FOUP conveyed by the conveyer system of FIG. 1.
Figure 3A:
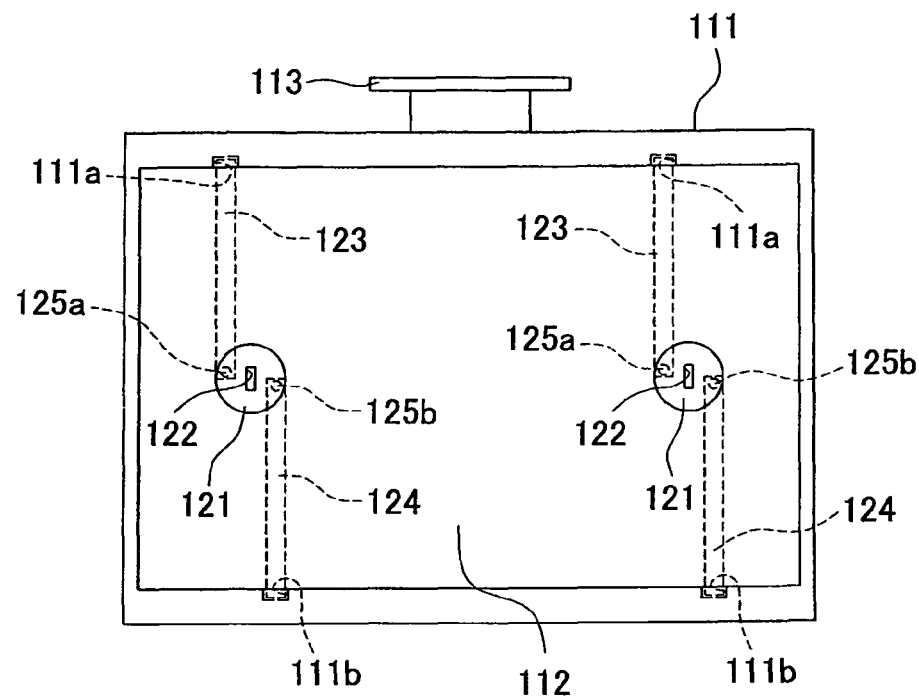
FIG. 3A is a diagram showing FIG. 2 as viewed from the front showing a state in which a cover to be described later in this specification is fixed to a main body.
Figure 3B:
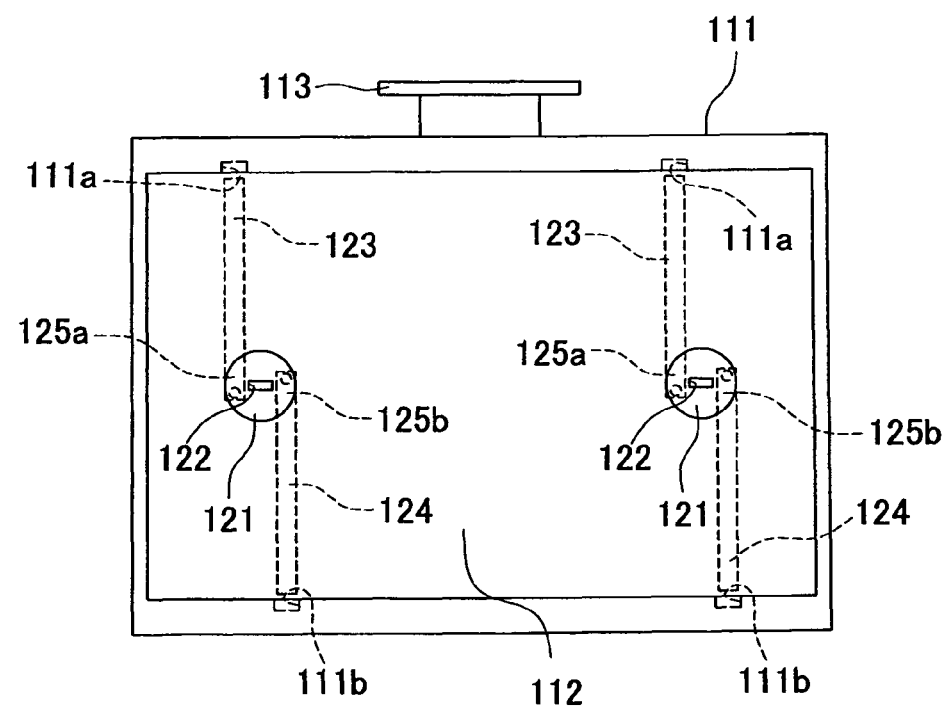
FIG. 3B is a diagram showing FIG. 2 as viewed from the front showing a state where the fixation of the cover to the main body is released.
Figure 4:
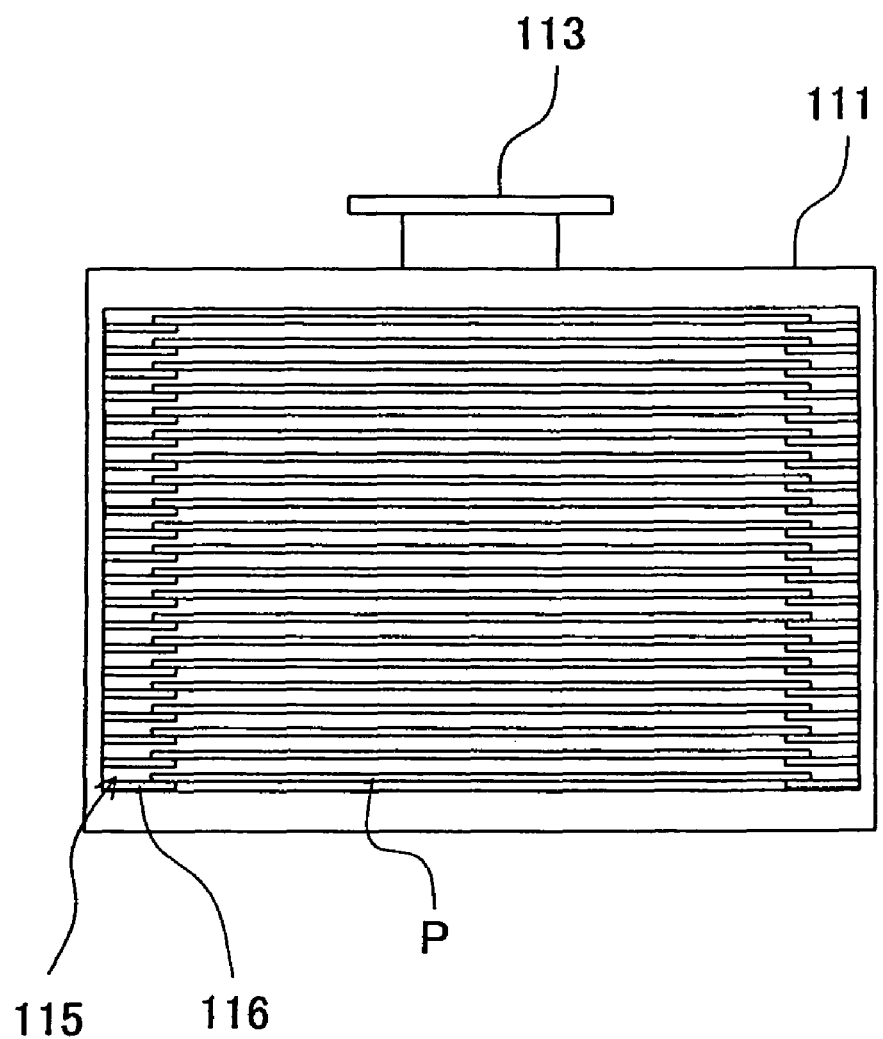
FIG. 4 is a diagram showing a state in which the cover is detached in FIG. 3A or 3B.
Figure 5:
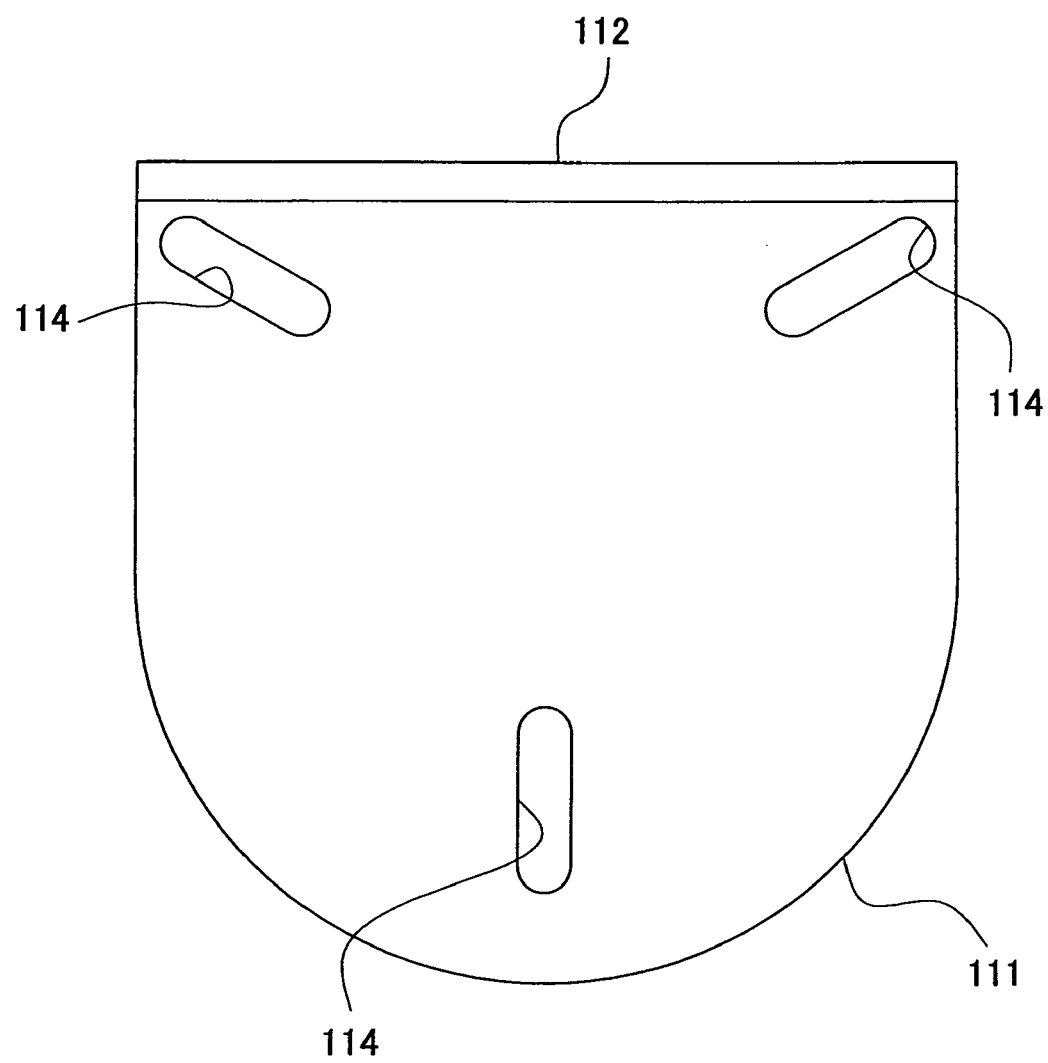
FIG. 5 is a diagram showing a bottom surface of the FOUP of FIG. 2.

Before describing each parts of the conveyer system 1, a FOUP 110 conveyed by the conveyer system 1 will be described. FIG. 2 is a schematic perspective view showing the FOUP 110. FIG. 3A is a diagram showing FIG. 2 as viewed from the front, showing a state in which a cover 112 to be described later in this specification is fixed to a main body 111. FIG. 3B is a diagram showing FIG. 2 as viewed from the front showing a state where the fixation of the cover 112 to the main body 111 is released. FIG. 4 is a diagram showing a state in which the cover 112 is detached in FIG. 3A or 3B. FIG. 5 is a diagram showing a bottom surface of the FOUP 110.

As shown in FIGS. 2 to 5, the FOUP 110 has the main body 111, the cover 112, a flange 113, three positioning holes 114, and a housing space 115. One side at the front part of FIG. 2 is opened in the main body 111, and the opening provides communication between the housing space 115 and the outside.

The cover 112 is a substantially rectangular plate-like body that closes the housing space 115 by covering the opening of the main body 111 and has two rotation plates 121, two engagement holes 122, two engagement members 123, and two engagement members 124. The two rotation plates 121 are circular plate-like bodies disposed at symmetrical positions with respect to the horizontal direction of FIG. 3 and rotatably supported with respect to the cover 112. The two engagement holes 122 are substantially rectangular holes independently formed on substantially central parts of the rotation plates 121 and tips of keys 23 described later in this specification are engaged with the engagement holes 122.

A lower end of each of the two engagement members 123 is swingably supported by a support member 125a in the vicinity of a left end of each of the two rotation plates 121 of FIG. 3 and extends upward from the position at which the engagement member 123 is supported by the support member 125a. An upper end of each of the two engagement members 124 is swingably supported by a support member 125b in the vicinity of a right end of each of the two rotation plates 121 of FIG. 3 and extends downward from the position at which the engagement member 124 is supported by the support member 125b.

As shown in FIG. 3A, upper end of the two engagement members 123 are engaged with an engagement groove 111a formed on an upper wall of the main body 111, and lower end of the two engagement members 124 are engaged with an engagement groove 111b formed on a lower wall of the main body 111, thereby fixing the cover 112 to the main body 111. When the rotation plates 121 are rotated anticlockwise in this state, the engagement members 123 are moved downward, and the engagement members 124 are moved upward, as shown in FIG. 3B, thereby unlocking the engagement between the engagement members 123 and the engagement groove 111a and the engagement between the engagement members 124 and the engagement groove 111b as well as releasing the fixation of the cover 112 to the main body 111.

The flange 113 is provided as projecting upward from a substantially central part of an upper surface of the main body 111, and an OHT (Over Head Transport) conveyer vehicle 130 (see FIG. 8) moving as being suspended from a ceiling grips the flange 113 to convey the FOUP 110.

Three positioning holes 114 are disposed in such a fashion that outer ends are positioned on apexes of a triangle and inner ends are positioned on apexes of another triangle.

In the housing space 115, a plurality of shelves 116 that are formed along a lateral wall of the housing space 115 are aligned in the vertical direction as shown in FIG. 4. Semiconductor substrates P are housed in the housing space 115 in such a fashion that edges thereof are supported by the shelves 116.

Figure 6:
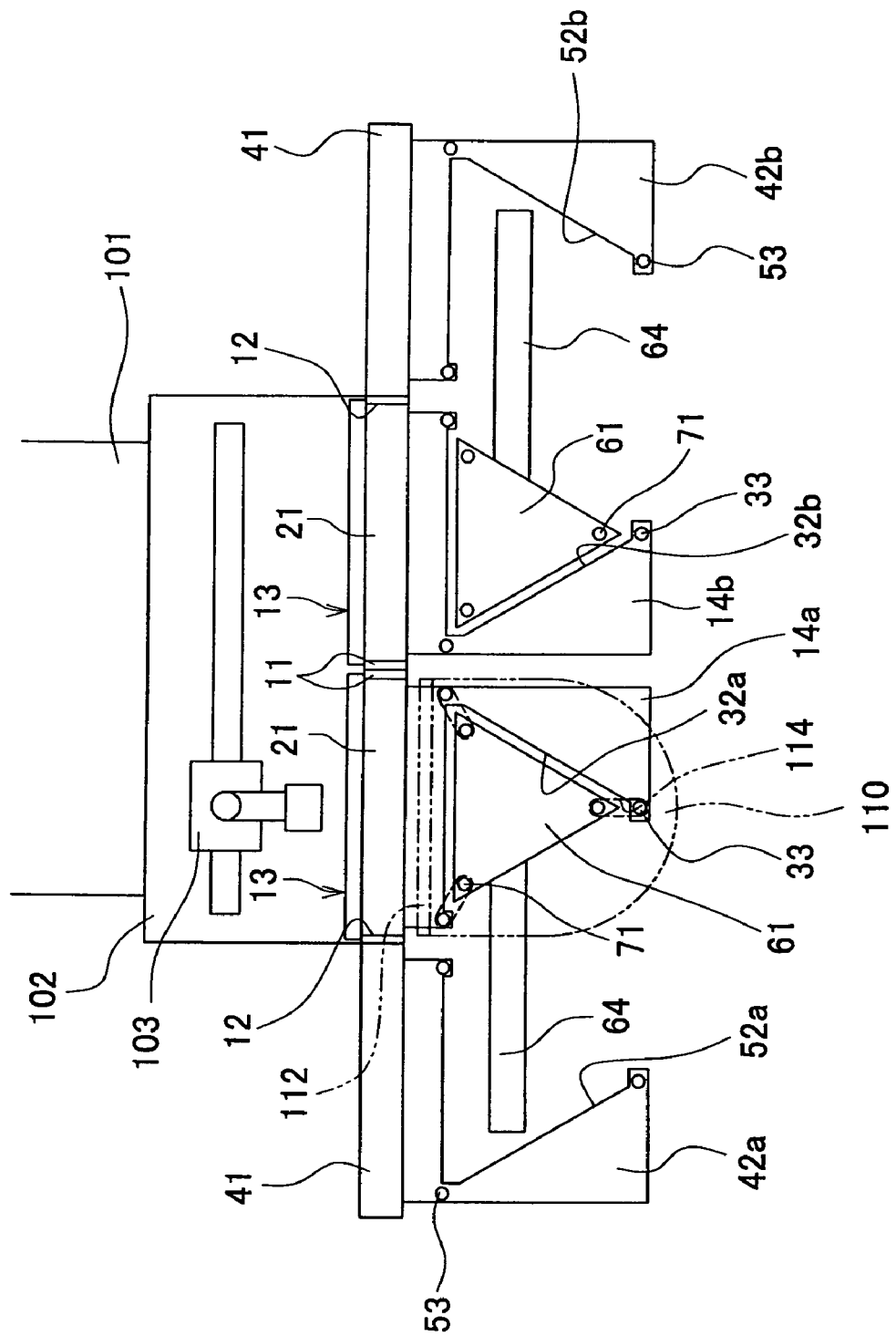
FIG. 6 is a plan view of FIG. 1.
Figure 7:
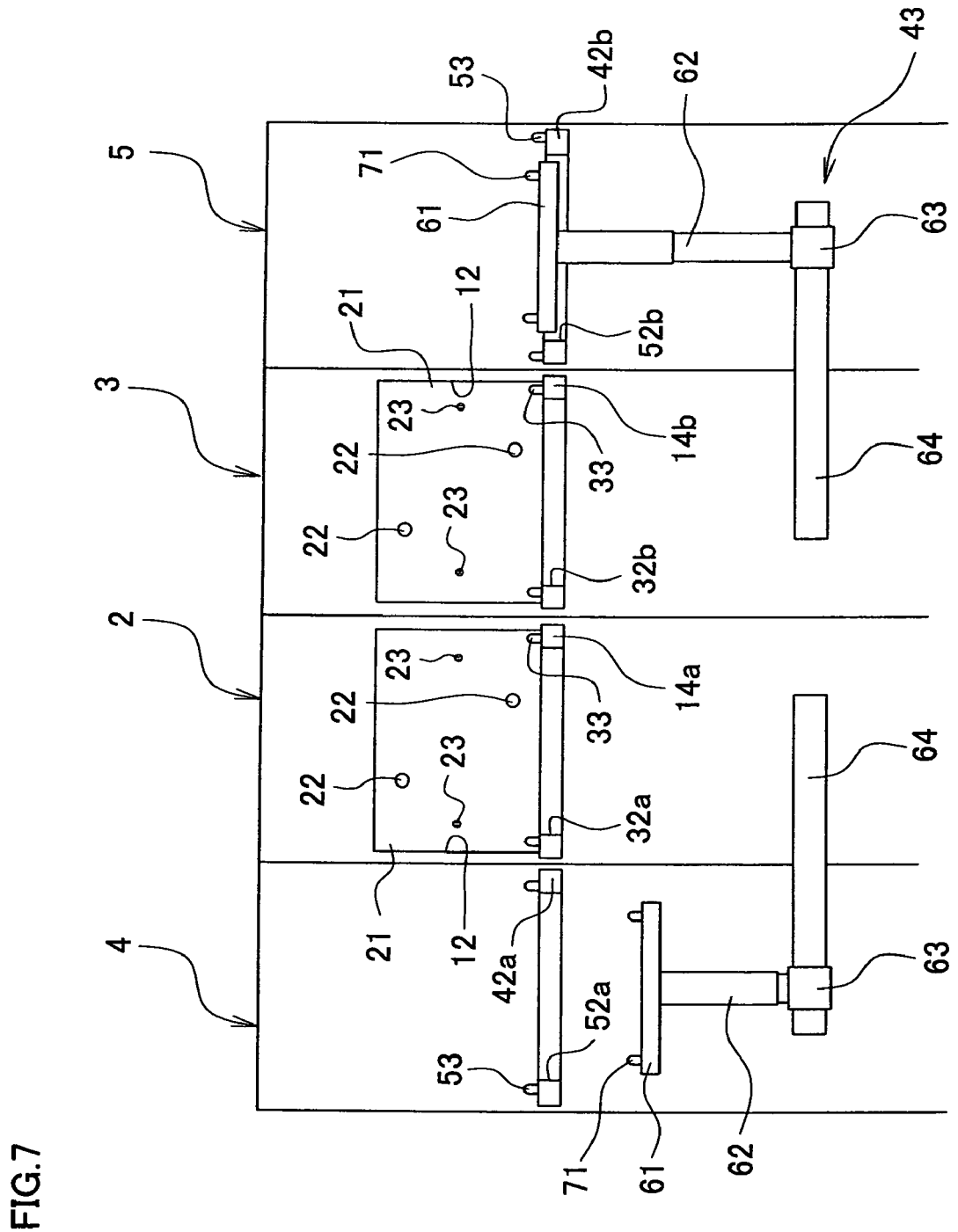
FIG. 7 is a front view of FIG. 1.

Hereinafter, each parts of the conveyer system 1 will be described. FIG. 6 is a plan view of FIG. 1. FIG. 7 is a front view of FIG. 1. As shown in FIGS. 1, 6, and 7, the conveyer system 1 has the two load ports 2 and 3 and the two relay units 4 and 5.

Each of the two load ports 2 and 3 are adjacent to a wall defining an isolated space 102. The isolated space 102 is isolated from the outside, and, in an internal part thereof, a semiconductor production device 101 and a robot 103 for delivering the semiconductor substrates P between the FOUP 110 and the semiconductor production device 101 are provided. The load port 2 has a substrate 11, an opening 12, a door unit 13, and a platform 14a. The load port 3 has a substrate 11, an opening 12, a door unit 13, which are the same as those of the load port 2, and a platform 14b.

The substrate 11 is provided on the wall defining the isolated space 102, which is a substantially rectangular plate-like body whose longitudinal direction is the vertical direction as viewed from the front. The opening 12 penetrates through the substrate 11 in the vicinity of an upper end of the substrate 11 and has a substantially rectangular shape of which a longitudinal direction is the horizontal direction as viewed from the front. The isolated space 102 is communicated to the outside via the opening 12.

The door unit 13 has a door plate 21, two suction devices 22, and two keys 23. The door plate 21 is a substantially rectangular plate-like body of which a longitudinal direction is the horizontal direction as viewed from the front. The door plate 21 covers the opening 12 except when allowing communication between the housing space 115 of the FOUP 110 and the isolated space 102 and opens the opening 12 by moving rearward and then downward for allowing communication between the housing space 115 and the isolated space 102.

The two suction devices 22 have suction openings on a surface of the door plate 21 to attach the cover 112 of the FOUP 110 placed on the platform 14a to the door plate 21 by suction. The tips of the two keys 23 are engaged with the engagement holes 122 of the FOUP 110 when the cover 112 of the FOUP 110 is attached by suction to the door plate 21 in a state where the cover 112 is brought close to the door plate 21. When the keys 23 are rotated in this state, the rotation plates 121 are rotated. With such constitution, the fixation of the cover 112 to the main body 111 is released as described above.

The platform 14a is a substantially rectangular plate-like body in a plan view, on which a notch (first notch) 32a is formed. The notch 32a extends from a lateral surface of the platform 14a facing to a platform 42a described later in this specification, i.e. the left lateral surface of the platform 14a in FIG. 6, toward the inside of the platform 14a and rightward in FIG. 6. Also, an upper wall surface of the notch 32a in FIG. 6 extends in the horizontal direction in FIG. 6, and a right wall surface in FIG. 6 extends as being inclined in such a fashion as to be positioned at the left part as approaching to the lower part of FIG. 6. Also, three positioning pins 33 are formed on a surface of the platform 14a. The three positioning pins 33 are provided corresponding to the three positioning holes 114, and the three positioning pins 33 and the outer ends of the positioning holes 114 are engaged with each other when the FOUP 110 is placed on the platform 14a, so that the FOUP 110 is placed on the platform 14a as being positioned.

The platform 14b is a substantially rectangular plate-like body in a plan view, on which a notch (first notch) 32b is formed. The notch 32b extends from a lateral surface of the platform 14b facing to a platform 42b described later in this specification, i.e. the right lateral surface of the platform 14b in FIG. 6, toward the inside of the platform 14b and leftward in FIG. 6. Also, an upper wall surface of the notch 32b in FIG. 6 extends in the horizontal direction in FIG. 6, and a left wall surface in FIG. 6 extends as being inclined in such a fashion as to be positioned at the right part as approaching to the lower part of FIG. 6. Also, three positioning pins 33 are formed on a surface of the platform 14b as in the platform 14a, and the FOUP 110 is placed on the platform 14b as being positioned.

Though not shown, the platforms 14a and 14b have a mechanism for moving the placed FOUP 110 backward and forward, and it is possible to bring the door plate 21 and the cover 112 close to each other by moving the FOUP 110 backward by this mechanism.

In the load ports 2 and 3, the covers 112 of the FOUPs 110 placed on the platforms 14a and 14b are attached by suction to the door plate 21 by the suction device 22 in a state where the FOUPs 110 are brought close to the door plate 21, and the door plate 21 to which the covers 112 are attached by suction are moved backward and then downward after releasing the fixation of the covers 112 to the main body 111 by rotating the rotation plates 121 by the keys 23, so that a communication is provided between the housing space 115 and the isolated space 102. Subsequently, the robot 103 delivers the semiconductor substrates P between the FOUPs 110 and the semiconductor production device 101.

The robot 103 moves between the two load ports 2 and 3 with respect to the horizontal direction of FIG. 6. In the case of providing load ports that are the same as the load ports 2 and 3 in place of the relay units 4 and 5, the robot 103 has to move among the four load ports. In contrast, since a distance of movement of the robot 103 is reduced in this embodiment, it is possible to efficiently perform the delivery of the semiconductor substrates P.

In the case of providing load ports in place of the relay units 4 and 5, it is necessary to use a space at the rear of the load ports, i.e. a space opposite to the platform, as an isolated space 102 since the semiconductor delivery is performed also between the FOUP 110 and the semiconductor production device 101 in these load ports; however, it is unnecessary to use the space at the rear of the relay units 4 and 5 as the isolated space 102 in this embodiment, thereby making it possible to reduce the size of the isolated space 102. With such constitution, contaminants such as dust hardly enter the isolated space 102.

The relay unit 4 has a substrate 41, a platform (third platform) 42a, and a conveyer device (first conveyer device) 43, and the relay unit 5 has a substrate 41, a conveyer device (first conveyer device) 43, that are the same as those of the relay unit 4, and a platform (third platform) 42b.

The substrate 41 is a substantially rectangular plate-like body that is disposed on the left of the substrate 11 of load port 2 in FIG. 6 and a right part of the substrate 11 of the load port 3 in FIG. 6 and elongated in the vertical direction as viewed from the front.

The platform 42a is a substantially rectangular plate-like body as viewed in a plan view, on which a notch (second notch) 52a is formed, and fixed to the substrate 41 at a height identical to that of the platform 14a and on the left of the platform 14a in FIG. 6. The notch 52a extends from a lateral surface of the platform 42a facing to the platform 14a, i.e. the right lateral surface of the platform 42a in FIG. 6, toward the inside of the platform 42a and leftward. Also, an upper wall surface of the notch 52a in FIG. 6 extends to the horizontal direction in FIG. 6, and a left wall surface in FIG. 6 extends as being inclined in such a fashion as to be positioned at the right part as approaching to the lower part of FIG. 6. Also, three positioning pins 53 are formed on a surface of the platform 42a. The three positioning pins 53 are provided corresponding to the three positioning holes 114, and the three positioning pins 53 and the outer ends of the positioning holes 114 are engaged with each other when the FOUP 110 is placed on the platform 42a, so that the FOUP 110 is placed on the platform 42a as being positioned.

The platform 42b is a substantially rectangular plate-like body as viewed in a plan view, on which a notch (second notch) 52b is formed, and fixed to the substrate 41 at a height identical to that of the platform 14b and on the right of the platform 14b in FIG. 6. The notch 52b extends from a lateral surface of the platform 42b facing to the platform 14b, i.e. the left lateral surface of the platform 42b in FIG. 6, toward the inside of the platform 42b and rightward. Also, an upper wall surface of the notch 52b in FIG. 6 extends to the horizontal direction, and a right wall surface in FIG. 6 extends as being inclined in such a fashion as to be positioned at the left part as approaching to the lower part of FIG. 6. Also, three positioning pins 53 that are the same as those of the platform 42a are formed on a surface of the platform 42b, and the FOUP 110 is placed on the platform 42b as being positioned. The position of the FOUP 110 as being placed on the platform 42a and the platform 42b is the first position according to this invention.

The conveyer device 43 is fixed to the substrate 41 and has a platform (second platform) 61, an elevation device 62, and a moving device 63. The platform 61 is a substantially regular triangular plate-like body in a plan view, which is attached to an upper end of the elevation device 62, and has the size that is housed inside the notches 32a, 32b, 52a and 52b when overlapping with the platforms 14a, 14b, 42a, and 42b in a plan view. The platform 61 can pass through the notches 32a, 32b, 52a, and 52b in the vertical direction. Three positioning pins 71 are formed on an upper surface of the platform 61. The three positioning pins 71 are positioned at apexes of a triangle in a plan view, and the FOUP 110 is placed on the platform 61 as being positioned when the three positioning pins 71 are engaged with the inner ends of the three positioning holes 114.

The elevation device 62 elevates and lowers the platform 61 attached to the upper end thereof. The platform 61 has the shape and the size that are capable of being housed in the notches 32a, 32b, 52a, and 52b in a plan view as described above. With such constitution, the platform 61 elevates and lowers as passing through the notches 32a, 32b, 52a, and 52b.

A lower end of the elevation device is fixed to an upper end of the moving device 63, and the moving device 63 moves along a guide 64 extending in the horizontal direction of FIG. 7 to move the platform 61 and the elevation device 62 in the horizontal direction of FIG. 7. The elevation device 62 and the moving device 63 are driven by a cylinder, a motor, and the like (not shown). Since the notch 32a extends rightward from the left lateral surface of the platform 14a, and since the notch 52a extends leftward from the right lateral surface of the platform 42a, it is possible to move the platform 61 and the elevation device 62 between the platform 14a and the platform 42a in a state where the platform 61 is moved to a position above the platforms 14a and 42a by the elevation device 62. Likewise, since the notch 32b extends leftward from the right lateral surface of the platform 14b, and since the notch 52b extends rightward from the left lateral surface of the platform 42b, it is possible to move the platform 61 and the elevation device 62 between the platform 14b and the platform 42b in a state where the platform 61 is moved to a position above the platforms 14b and 42b by the elevation device 62. The elevation device 62, the moving device 63, and the guide described above correspond to the first moving unit according to this invention.

Since each of the relay units 4 and 5 has the conveyer device 43, by disposing the relay units 4 and 5 adjacent to the load ports 2 and 3, it is unnecessary to separately perform a step for attaching a conveyer device 43, and it is possible to easily structure the conveyer system 1. Since the load ports 2 and 3 are obtainable by changing platforms of conventional load ports to the platforms 14a and 14b, it is possible to use conventional parts for the parts other than the platforms 14a and 14b of the load ports 2 and 3.

Hereinafter, methods for placing on the platforms 14a and 14b the FOUPs 110 in which the semiconductor substrates P to be processed by the semiconductor production device 101 are housed will be described. Note that only the method for placing the FOUP 110 on the platform 14a will be described since the method for placing the FOUP 110 on the platform 14a and the method for placing the FOUP 110 on the platform 14b are the same except that the directions of transfers by the moving device 63 are reverse to each other.

Figure 8A:
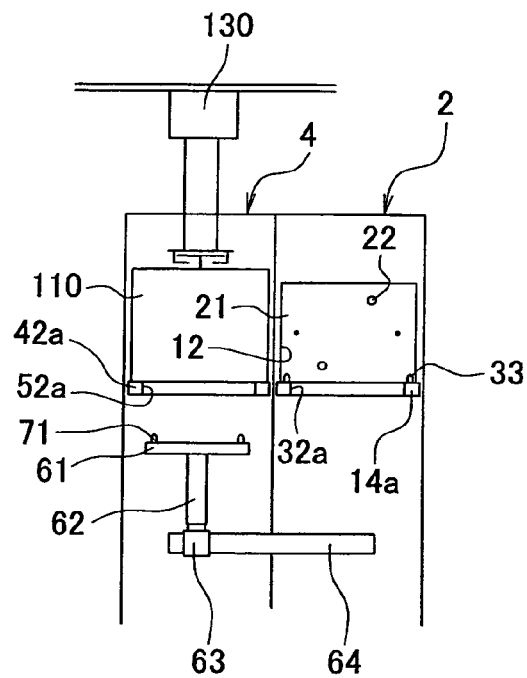
FIG. 8A is a diagram showing a step of a procedure of conveyance of the FOUP.

FIGS. 8A to 8D are diagrams showing a procedure of placing the FOUP 110 on the platform 14a. In order to place the FOUP 110 on the platform 14a, the FOUP 110 conveyed by the OHT conveyer vehicle 130 is placed on the platform 42a as shown in FIG. 8A.

Figure 8B:
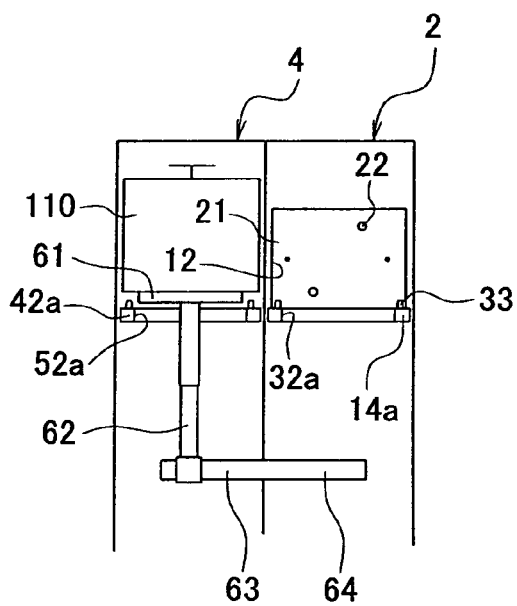
FIG. 8B is a diagram showing a step of a procedure of conveyance of the FOUP next to the step of FIG. 8A.

Subsequently, the platform 61 is moved to a position overlapping with the platform 42a by the moving device 63 as shown in FIG. 8B and then elevated by the elevation device 62 so that an upper surface of the platform 61 is above an upper surface of the platform 42. Thus, the FOUP 110 is placed on the upper surface of the platform 61.

Figure 8C:
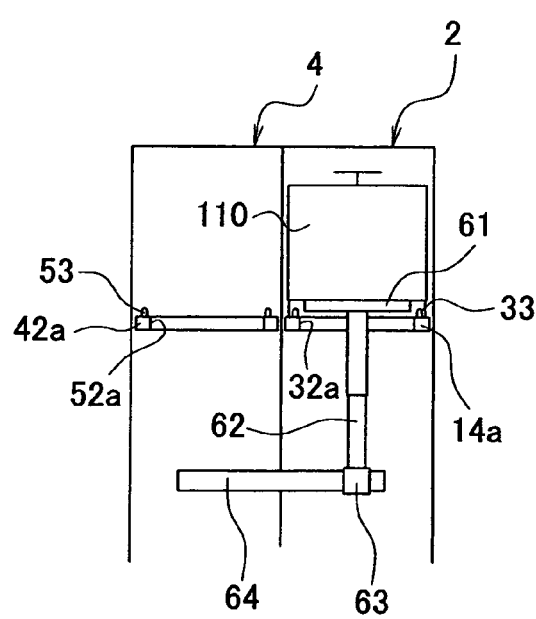
FIG. 8C is a diagram showing a step of a procedure of conveyance of the FOUP next to the step of FIG. 8B.
Figure 8D:
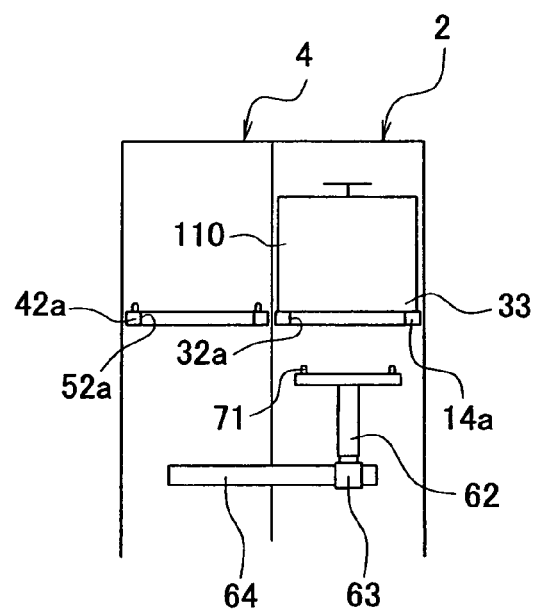
FIG. 8D is a diagram showing a step of a procedure of conveyance of the FOUP next to the step of FIG. 8C.

Subsequently, the platform 61 is moved rightward to a position overlapping with the platform 14a by the moving device 63 as shown in FIG. 8C and then lowered to a position below the platform 14a by the elevation device 62 as shown in FIG. 8D. Thus, the FOUP 110 is placed on the upper surface of the platform 14a.

Since the conveyance of the FOUP 110 shown in FIGS. 8B to 8D is performed by the conveyer device 43 disposed below the platforms 14a and 42a, the movement of the OHT conveyer vehicle 130 is not hindered. Therefore, by conveying the FOUP 110 housing the semiconductor substrates P which are to be subsequently processed by the semiconductor production device 101 to a position above the platform 42a by the OHT conveyer vehicle 130 and by placing the FOUP 110 on the platform 42a from the OHT conveyer vehicle 130 at the time when the FOUP 110 placed on the platform 42a is placed on the platform 14a, it is possible to efficiently perform the conveyance of the FOUP 110.

After that, the housing space 115 and the isolated space 102 are communicated with each other, and the semiconductor substrates P in the FOUP 110 are delivered to the semiconductor production device 101 by the robot 103 as described in the foregoing. Further, after completion of processing by the semiconductor production device 101, the semiconductor substrates P are housed in the housing space 115 of the FOUP 110 by the robot 103, and then the housing space 115 and the isolated space 102 are closed. The FOUP 110 housing the semiconductor substrates for which the processing by the semiconductor production device 101 is completed is conveyed by the OHT conveyer vehicle 130.

After that, transfer of the FOUP 110 from the platform 42a to the platform 14a and transfer of the FOUP 110 from the OHT conveyer vehicle 130 to the platform 42a are repeated. With such constitution, a time between the completion of processing by the semiconductor production device 101 on the semiconductor substrates P housed in the FOUP 110 and the processing on the semiconductor substrates P housed in the next FOUP 110 is shortened, thereby improving a use efficiency of the semiconductor production device 101.

According to the above-described embodiment, when placing the FOUP 110 on the platforms 14a and 14b, the FOUP 110 is successively placed on the platforms 14a and 14b by transferring the FOUP 110 from the platforms 42a and 42b to the platforms 14a and 14b by the conveyer device 43 after placing the FOUP 110 on the platforms 42a and 42b by the OHT conveyer vehicle 130. Therefore, a time between the completion of processing by the semiconductor production device 101 on the semiconductor substrates P housed in the FOUP 110 and the processing on the semiconductor substrates P housed in the next FOUP 110 is shortened, thereby improving the use efficiency of the semiconductor production device 101.

Also, by disposing the relay units 4 and 5 adjacent to the load ports 2 and 3 in place of adding load ports adjacent to the load ports 2 and 3, a distance of movement of the robot 103 is reduced as compared to that of the case of adding load ports. With such constitution, it is possible to efficiently perform the delivery of the semiconductor substrates P between the FOUP 110 and the semiconductor production device 101.

In the case of adding load ports in place of providing the relay units 4 and 5, delivery of the semiconductor substrates P is performed between the FOUP 110 and the semiconductor production device 101 in the added load ports. Therefore, it is necessary to use a space at the rear of the added load ports as the isolated space 102. However, in this embodiment, since it is unnecessary to use the space of the relay units 4 and 5 opposite to the platforms 42a and 42b as the isolated space 102, it is possible to reduce the size of the isolated space 102. With such constitution, contaminants such as dust hardly enter the isolated space 102.

Since each of the relay units 4 and 5 are provided with the conveyer device 43, by disposing the relay units 4 and 5 adjacent to the load ports 2 and 3, it is unnecessary to separately perform a step for attaching a conveyer device, and it is possible to easily structure the conveyer system 1. Further, since the load ports 2 and 3 are obtainable by replacing platforms of conventional load ports with the platforms 14a and 14b, conventional parts may be used as they are for parts other than the platforms 14a and 14b.

Since the positioning pins 33, 53, and 71 are provided the upper surface of on the platforms 14a and 14b, the platforms 42a and 42b, and the platform 61, the FOUP 110 is placed on the platforms 14a and 14b, the platforms 42a and 42b, and the platform 61 as being positioned.

Hereinafter, modifications of the first embodiment will be described. Parts having structures same as those of the first embodiment are denoted by the same reference numerals, and description thereof are omitted as required.

Figure 9:
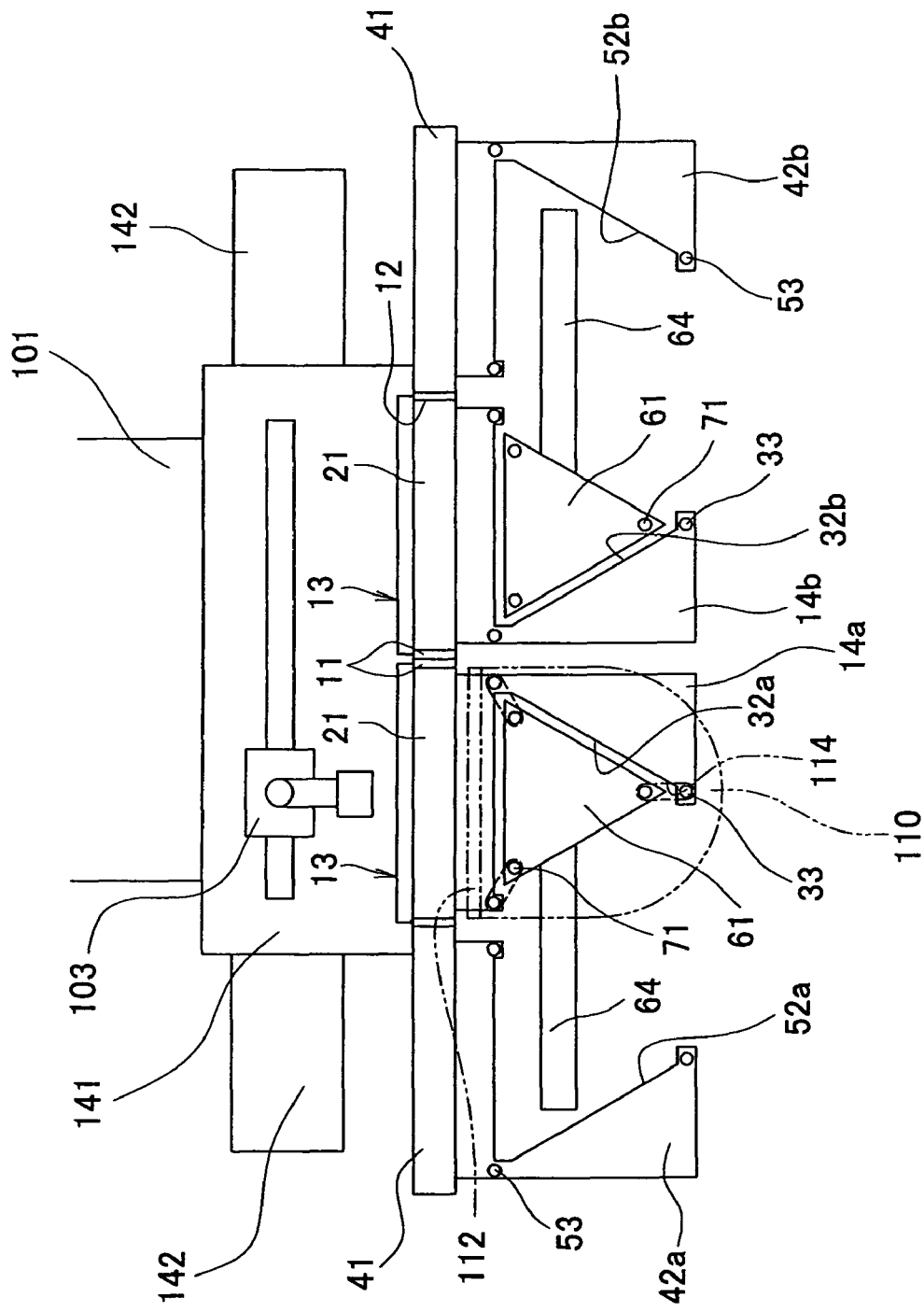
FIG. 9 is a diagram corresponding to FIG. 6 of the first modification.

In a first modification, an isolated space 141 is at the rear of the load ports 2 and 3 as shown in FIG. 9 in the same manner as in the first embodiment, and a semiconductor production device 142 is disposed at the rear of the relay units 4 and 5. In the case of providing load ports in place of the relay units 4 and 5, it is necessary to dispose a door unit 13, the robot 103 in the isolated space 141 at the rear of the added load ports, and it is impossible to dispose the semiconductor production device 142 in the isolated space 141. However, in the case of the first modification, since it is possible to dispose the semiconductor production device 142 in the space at the rear of the relay units 4 and 5, it is possible to effectively use the space.

Though the conveyer devices 43 are provided at the relay units 4 and 5 in the first embodiment, the conveyer devices 43 may be provided at the load ports 2 and 3. Alternatively, the conveyer devices 43 may be provided over the load ports 2 and 3 and the relay units 4 and 5. Alternatively, the conveyer devices 43 may be an independent device that is not provided at any of the load ports 2 and 3 and the relay units 4 and 5.

Though the FOUP 110 is transferred from the platforms 42a and 42b to the platforms 14a and 14b by the conveyer device 43 after the FOUP 110 is placed on the platforms 42a and 42b from the OHT conveyer vehicle 130 in the first embodiment, the FOUP 110 may be directly placed on the platforms 14a and 14b on which no FOUP 110 is placed from the OHT conveyer vehicle 130 in the case where no FOUP 110 is placed on either one of the platforms 14a and 14b, while transferring the FOUP 110 to the platforms 42a and 42b from the OHT conveyer vehicle 130 only in the case where the FOUP 110 is placed on each of the platforms 14a and 14b when the OHT conveyer vehicle 130 transfers the FOUP 110.

The shape of the notch is not limited to that of the first embodiment insofar as the notch formed on the platform (first platform) of the load port extends from a lateral surface close to the adjacent relay unit to the inside of the platform of the load port, the platform (third platform) of the relay unit extends from a lateral surface close to the adjacent load port to the inside of the platform of the relay unit, and the platform 61 is movable in the vertical direction while passing through the notches.

Though the cover 112 is retained at the door plate 21 by suction by the suction device 22 in the first embodiment, the cover 112 may be retained at the door plate 21 by another unit in which a spring mechanism is added to the key 23, for example.

The operation of the FOUP 110 may be structured reverse to that of the first embodiment. That is, the structure may be such that the processed FOUP 110 is transferred on the platforms 42a and 42b, so that the next FOUP 110 is immediately placed on the platforms 14a and 14b.

Though the platforms 42a and 42b are structured to be at the same height with the platforms 14a and 14b and adjacent to the platforms 14a and 14b in the first embodiment, the platforms 42a and 42b may be provided at a height different from the platforms 14a and 14b.

Second Embodiment

Hereinafter, the second embodiment will be described. Note that features of the second embodiment that are different from those of the first embodiment will be described, and descriptions on structures same as those of the first embodiment will be omitted as required.

Figure 10:
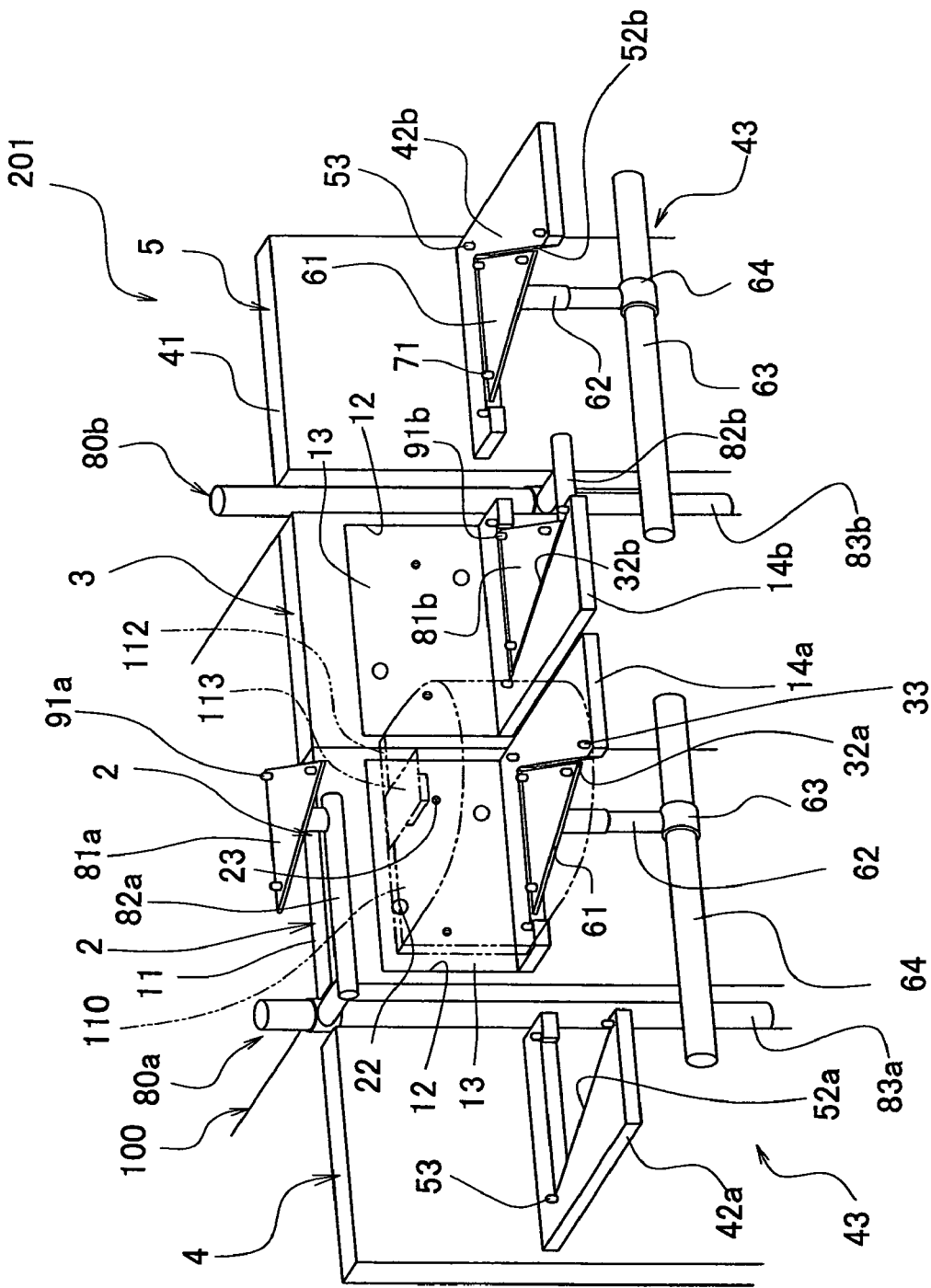
FIG. 10 is a schematic block diagram showing the second embodiment, which corresponds to FIG. 1.
Figure 11:
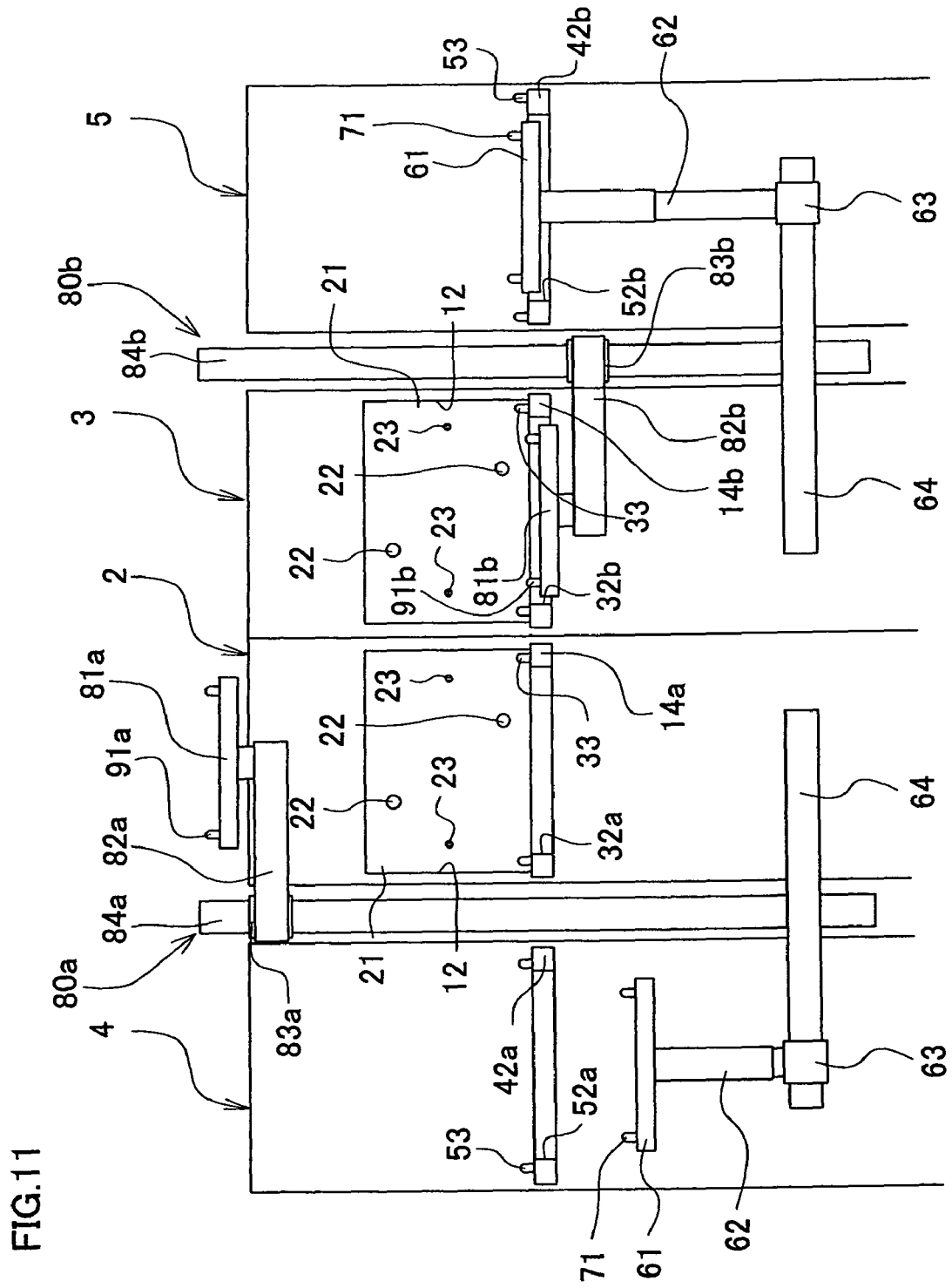
FIG. 11 is a front view showing the second embodiment, which corresponds to FIG. 7.

FIG. 10 is a schematic block diagram showing the second embodiment, which corresponds to FIG. 1. FIG. 11 is a front view showing the second embodiment, which corresponds to FIG. 7. As shown in FIGS. 10 and 11, in a conveyer system 201 according to the second embodiment, a gap is defined between the load port 2 and the relay unit 4, and a gap is defined between the load port 3 and the relay unit 5. Further, in the conveyer system 201, conveyer devices (second conveyer devices) 80a and 80b are provided between the load port 2 and the relay unit 4 and between the load port 3 and the relay unit 5 besides structures same as those of the first embodiment.

The conveyer device 80a has a platform (forth platform) 81a, an arm 82a, a moving device (second moving device) 83a, and a guide 84a. The platform 81a has the shape same as that of the platform 61, and three positioning pins 91a that are the same as the three positioning pins 71 are provided on an upper surface of the platform 81a. The arm 82a connects the platform 81a and the moving device 83a to each other. The moving device 83a is movable along the guide 84a extending in the vertical direction. When the moving device 83a moves in the vertical direction, the arm 82a and the platform 81a move in the vertical direction. Since the moving device 83a moves in the vertical direction, the platform 81a passes through the platform 14a in the vertical direction in the same manner as the platform 61. The arm 82a passes through the notch 32a when the platform 81a passes though the platform 14a and has the structure of not contacting the platform 14a.

The conveyer device 80b has a platform (forth platform) 81b, an arm 82b, a moving device (second moving device) 83b, and a guide 84b. The platform 81b has the shape same as that of the platform 81a, and three positioning pins 91b that are the same as the three positioning pins 91a are provided on an upper surface of the platform 81b. The arm 82b connects the platform 81b and the moving device 83b to each other. The arm 82a and the arm 82b have the shapes that are symmetrical to each other with respect to the horizontal direction of FIG. 11. The moving device 83b is movable along the guide 84b extending in the vertical direction. When the moving device 83b moves in the vertical direction, the arm 82b and the platform 81b move in the vertical direction. Since the moving device 83b moves in the vertical direction, the platform 81b passes through the platform 14b in the vertical direction in the same manner as the platform 81a. The arm 82b passes through the notch 32b when the platform 81b passes though the platform 14b and has the structure of not contacting the platform 14b. The position of the FOUP 110 placed on the platforms 81a and 81b when the platforms 81a and 81b are at the predetermined position above the platforms 14a and 14b as described above corresponds to the second position according to this invention.

Hereinafter, a method for replacing the FOUP 110 placed on the platforms 14a and 14b and housing semiconductor substrates P after completion of processing by the semiconductor production device 101 with the FOUP 110 housing semiconductor substrates P to be processed by the semiconductor production device 101 will be described. Since the method for replacing the FOUPs 110 in the platform 14a and the method for replacing the FOUPs 110 in the platform 14b are the same except that directions of transfers by the moving device 63 are reverse to each other, only the method for replacing the FOUPs 110 in the platform 14a will be described below.

FIGS. 12A to 12D are diagrams showing a procedure of placing the FOUP 110 on the platform 14a. Note that, before performing the procedure described below, the platform 81a is positioned at the second position that is above the platform 14a, and the platform 61 is positioned below the platform 14a.

In order to replace the FOUP 110 placed on the platform 14a and housing semiconductor substrates P after completion of processing by the semiconductor production device 101 with the FOUP 110 housing semiconductor substrates P to be processed by the semiconductor production device 101, the FOUP 110 to be placed on the platform 14a is placed on the platform 81a by the OHT conveyer vehicle 130 as shown in FIG. 12A.

Subsequently, the platform 61 is elevated by the elevation device 62 to a position a little above the platform 14a as shown in FIG. 12B. Thus, the FOUP 110 placed on the platform 14a is transferred to the platform 61. Subsequently, as shown in FIG. 12C, the platform 61 is moved leftward in FIG. 12C to a position overlapping with the platform 42a by the moving device 63, and the platform 81a is lowered to a position a little below the platform 14a by the moving device 83a. The moving device 63 and the moving device 83a are moved so as to avoid contact between the FOUP 110 placed on the platform 61 and the arm 82a. Thus, the FOUP 110 placed on the platform 81a is transferred to the platform 14a.

Subsequently, the platform 61 is moved below the platform 42a by the elevation device 62 to transfer the FOUP 110 placed on the platform 61 to the platform 42a as shown in FIG. 12D. The FOUP 110 placed on the platform 42a is conveyed by the OHT conveyer vehicle 130 for the next process step. After that, a FOUP 110 housing semiconductor substrates P to be subsequently processed by the semiconductor production device 101 is placed on the platform 42a by the OHT conveyer vehicle 130.

The housing space 115 and the isolated space 102 are communicated with each other in the FOUP 110 placed on the platform 14a in the same manner as in the first embodiment, so that the semiconductor substrates P are delivered to the semiconductor production device 101 by the robot 103. After the processing in the semiconductor production device 101 is completed, the semiconductor substrates are housed in the housing space 115 of the FOUP 110 by the robot 103, and then the housing space 115 and the isolated space 102 are closed.

Subsequently, in a manner reverse to the above description, the platform 61 is elevated to a position a little above the platform 42a by the elevation device 62 as shown in FIG. 12C. Thus, the FOUP 110 placed on the platform 42a is transferred to the platform 61.

Subsequently, by elevating the platform 81a by the moving device 83a as shown in FIG. 12B, the FOUP 110 placed on the platform 14a is transferred to the platform 81a, and the platform 81a on which the FOUP 110 is placed is moved further upward. At the same time, the platform 61 is moved rightward in FIG. 12B to a position overlapping with the platform 14a by the moving device 63. In this case, too, the moving device 63 and the moving device 83a are moved so as to avoid contact between the FOUP 110 placed on the platform 61 and the arm 82a.

Subsequently, the platform 61 is lowered below the platform 14a by the elevation device 62 to transfer the FOUP 110 placed on the platform 61 to the platform 14a. The housing space 115 and the isolated space 102 are communicated with each other in the FOUP 110 transferred to the platform 14a in the same manner as in the first embodiment, so that the semiconductor substrates P are delivered to the semiconductor production device 101 by the robot 103. After the processing in the semiconductor production device 101 is completed, the semiconductor substrates are housed in the housing space 115 of the FOUP 110 by the robot 103, and then the housing space 115 and the isolated space 102 are closed.

As shown in FIG. 12A, the FOUP 110 placed on the platform 81a is conveyed for the next process step by the OHT conveyer vehicle 130. Hereafter, the same process step is repeated.

By replacing the FOUPs 110 as described above, it is possible to perform the operation of moving the FOUP 110 placed on the platform 14a leftward in FIGS. 12A to 12D and transferring the FOUP 110 placed on the platform 81a by moving the FOUP 110 downward, and the operation of moving the FOUP 110 placed on the platform 14a by elevating the platform 81a upward in FIGS. 12A to 12D and transferring the FOUP 110 placed on the platform 42a by moving the FOUP 110 rightward independently from the operation of the OHT conveyer vehicle 130. Therefore, it is possible to replace the FOUPs 110 immediately after completion of the processing on the semiconductor substrates P housed in the FOUP 110, thereby improving a use efficiency of the semiconductor production device 101.

Hereinafter, modifications of the second embodiment will be described. Parts having structures same as those of the second embodiment are denoted by the same reference numerals, and description thereof are omitted as required.

Figure 13A:
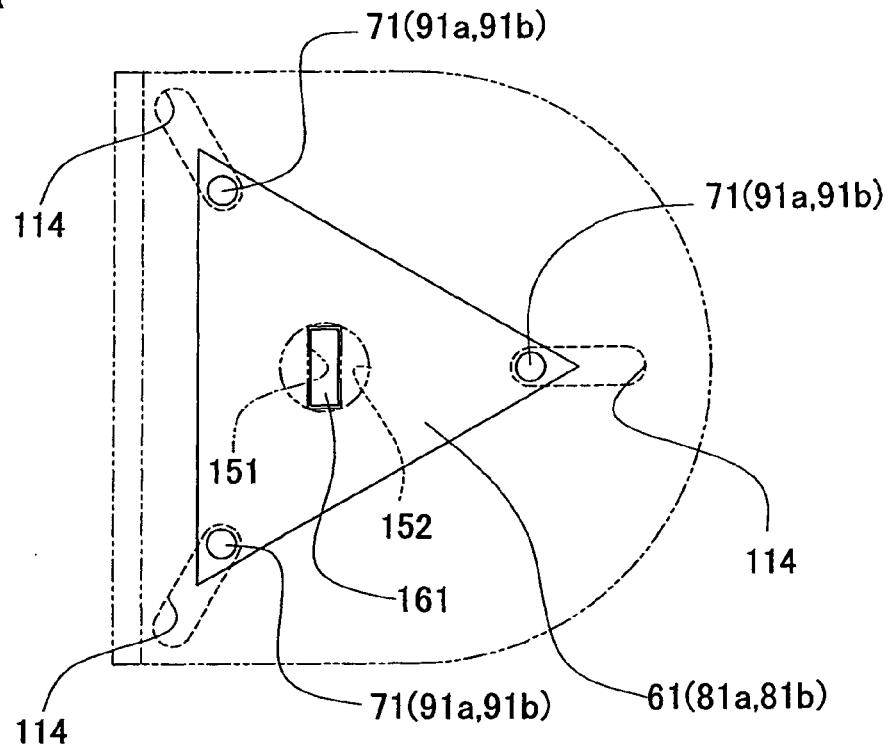
FIG. 13A is a diagram showing a FOUP and a platform in a second modification in the state that the projection of the platform fitted into the opening of the FOUP.
Figure 13B:
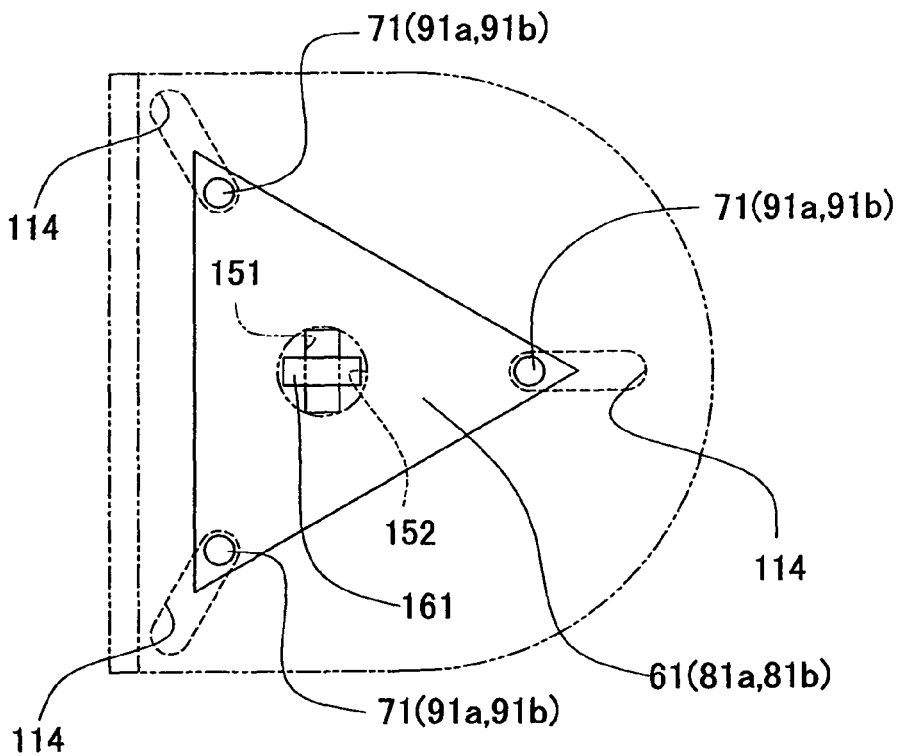
FIG. 13B is a diagram showing a FOUP and a platform in a second modification in the state that the FOUP is fixed to the platform.

In a second modification, as shown in FIG. 13A, 13B, the FOUP 110 has a substantially rectangular opening 151 formed on a lower surface of the FOUP 110 and a substantially oval hole 152 extending upward from the lower surface of the FOUP 110 so as to enclose the opening 151, and each of the platforms 61, 81a, and 81b is provided with a projection 161 that is rotatable and can be fitted into the opening 151. In this case, in a state where the projection 161 is fitted into the opening 151 as shown in FIG. 13A, the projection 161 rotates by about 90 degrees to be lowered as shown in FIG. 13B, so that the FOUP 110 is fixed to the platforms 61, 81a, and 81b. The projection 161 provided on the platform 61 corresponds to the first fixing unit according to this invention, and the projections 161 provided on the platforms 81a and 81b correspond to the second fixing unit according to this invention.

Since the platforms 61, 81a, and 81b have an area smaller than those of the platforms 14a, 14b, 42a, and 42b and are movable, the FOUP 110 placed on the platforms is in an unstable state. However, as described above, by fixing the FOUP 110 to the platforms 61, 81a, and 81b, the FOUP 110 is prevented from falling out from the platforms 61, 81a, and 81b. Also, it is possible to prevent the user from taking away the FOUP 110 placed on the platforms 61, 81a, and 81b by mistake. In the first embodiment, the hole 152 having the opening 151 may be formed on the FOUP 110 and the projection 161 may be formed on the platform 61 in the same manner as in the second modification.

The platforms 42a and 42b may be omitted. In this case, after moving the platform 61 to the position of FIG. 12C by the moving device 63, the FOUP 110 placed on the platform 61 is conveyed to the next process step by the OHT conveyer vehicle 130 in such state, and the next FOUP 110 is placed on the platform 61 by the OHT conveyer vehicle 130 in the state of FIG. 12C.

The same modification may be made in the first embodiment. In the case of the first embodiment, the FOUP 110 is placed on the platform 61 that is elevated by the elevation device 62 as shown in FIG. 8B in place of placing the FOUP 110 on the platform 42a as shown in FIG. 8A.

Though each of the load port 2 and the relay unit 4 and the load port 3 and the relay unit 5 are disposed with a gap being defined therebetween in order that the guides 84a and 84b for moving the moving devices 83a and 83b in the vertical direction are disposed between the load port 2 and the relay unit 4 and between the load port 3 and the relay unit 5 in the second embodiment, the positions of the guides 84a and 84b are not limited to the above, and the guides 84a and 84b may be positioned at any position insofar as the FOUP 110 does not contact the guides 84a and 84b when the platform 61 is moved in the horizontal direction by the moving device 63. The load ports 2 and 3 and the relay units 4 and 5 may be disposed without the gap being defined between the load port 2 and the relay unit 4 and between the load port 3 and the relay unit 5 in the second embodiment in the same manner as in the first embodiment.

Third Embodiment

Hereinafter, a third embodiment according to this invention will be described. Note that since only a part of the third embodiment is different from the first embodiment, the part that is different from the first embodiment will be described, and descriptions on the parts same as the first embodiment will be omitted as required.

Figure 14:
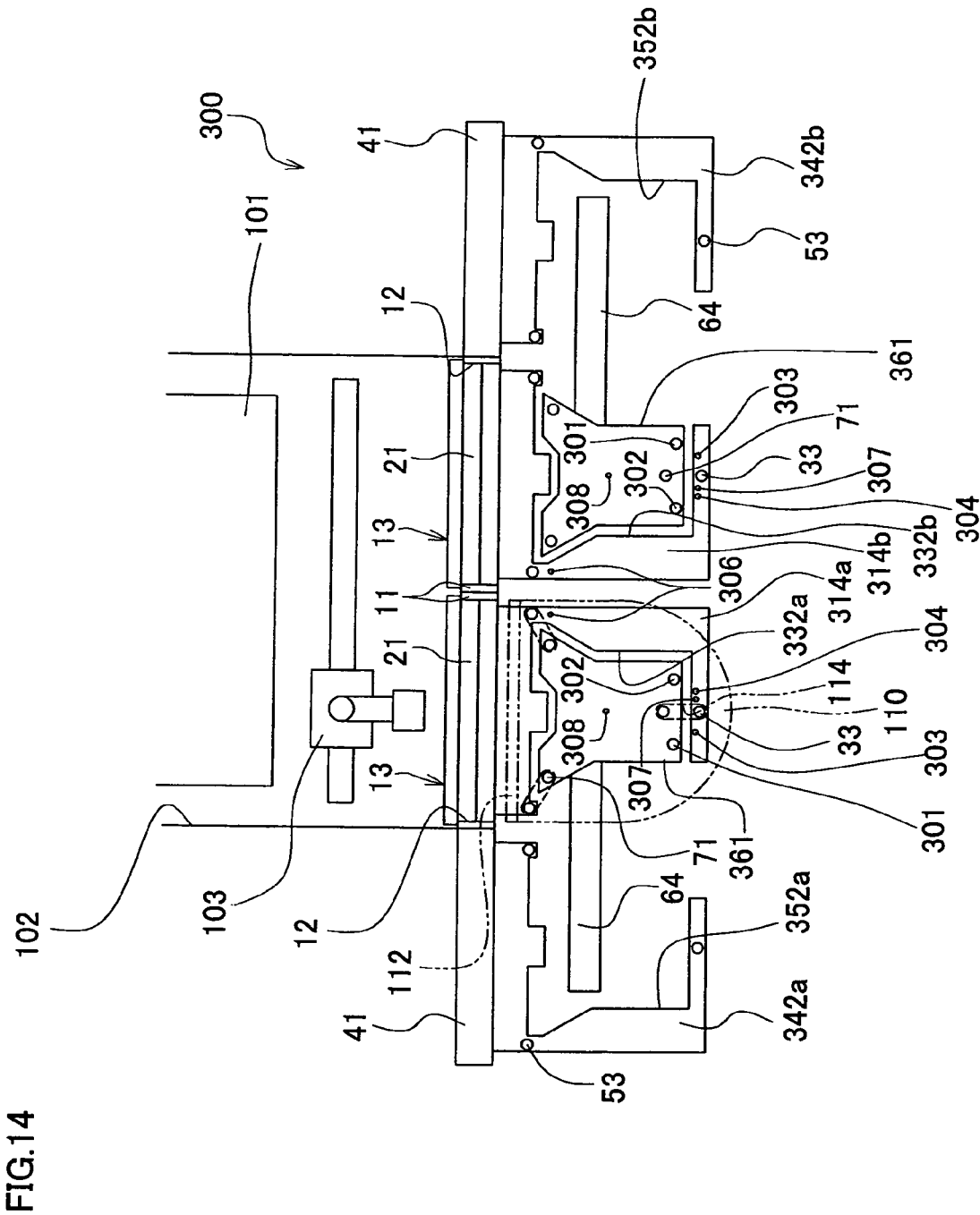
FIG. 14 is a plan view corresponding to FIG. 6 in a third embodiment.
Figure 15A:
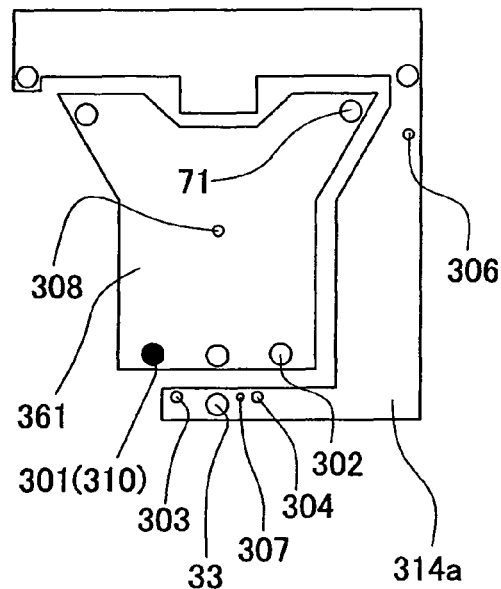
FIG. 15A is an enlarged view showing a platform in FIG. 14 in the state that the identification pin is attached to one of the holes of the platforms.
Figure 15B:
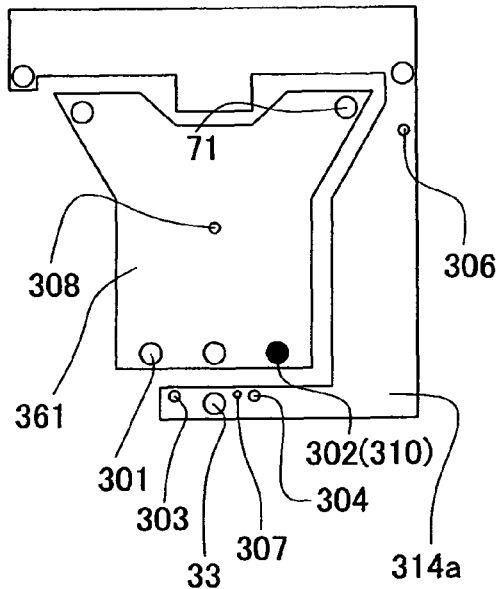
FIG. 15B is an enlarged view showing a platform in FIG. 14 in the state that the identification pin is attached to one of the holes, which is different from the hole that the identification pin is attached in FIG. 15A, of the platforms.
Figure 15C:
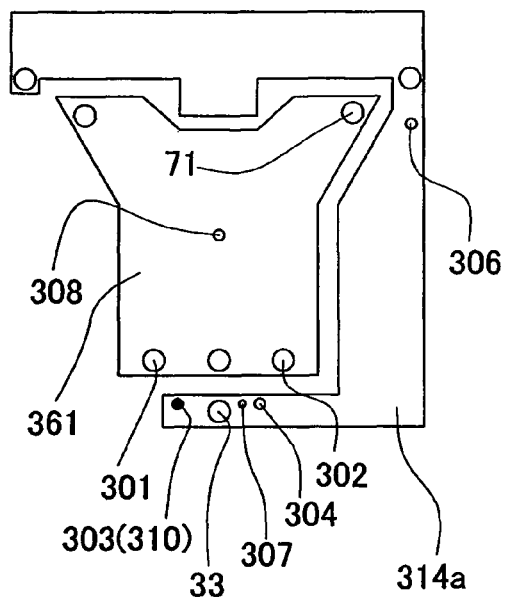
FIG. 15C is an enlarged view showing a platform in FIG. 14 in the state that the identification pin is attached to one of the holes, which is different from the hole that the identification pin is attached in FIGS. 15 and 15B, of the platforms.
Figure 15D:
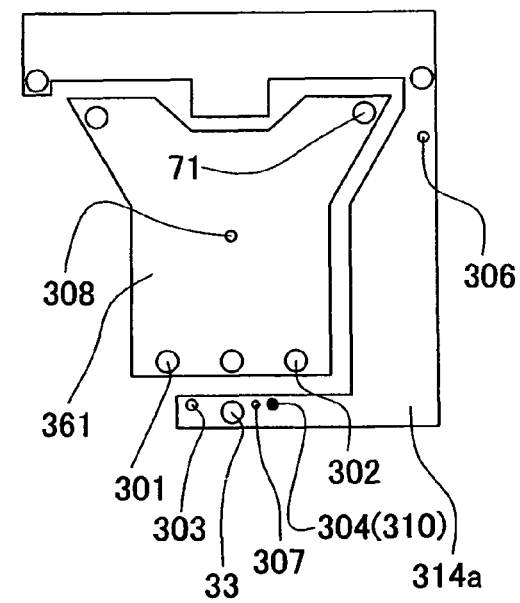
FIG. 15D is an enlarged view showing a platform in FIG. 14 in the state that the identification pin is attached to one of the holes, which is different from the hole that the identification pin is attached in FIGS. 15A to 15C, of the platforms.
Figure 16A:
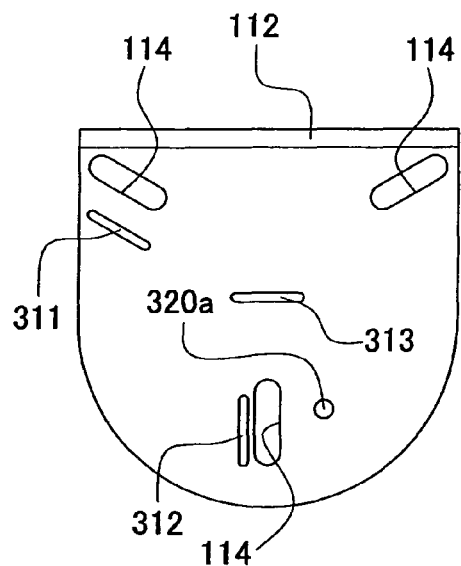
FIG. 16A is a plan view showing a bottom surface of the FOUP in the third embodiment in the state that information pad is provided corresponding to the identification pin in FIG. 15A.
Figure 16B:
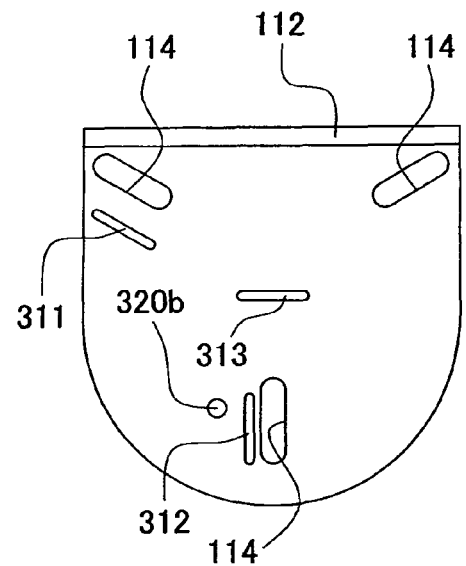
FIG. 16B is a plan view showing a bottom surface of the FOUP in the third embodiment in the state that information pad is provided corresponding to the identification pin in FIG. 15B.
Figure 16C:
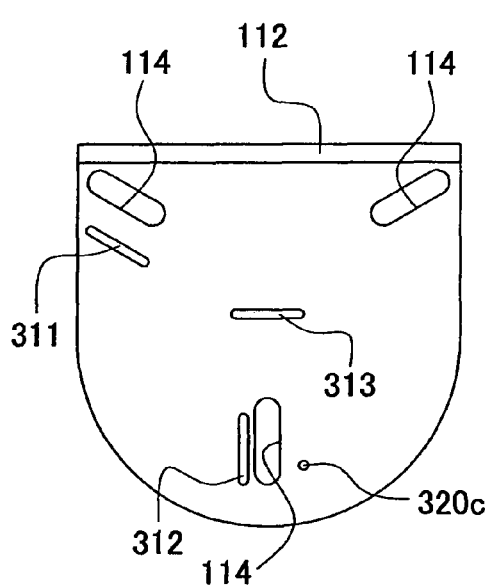
FIG. 16C is a plan view showing a bottom surface of the FOUP in the third embodiment in the state that information pad is provided corresponding to the identification pin in FIG. 15C.
Figure 16D:
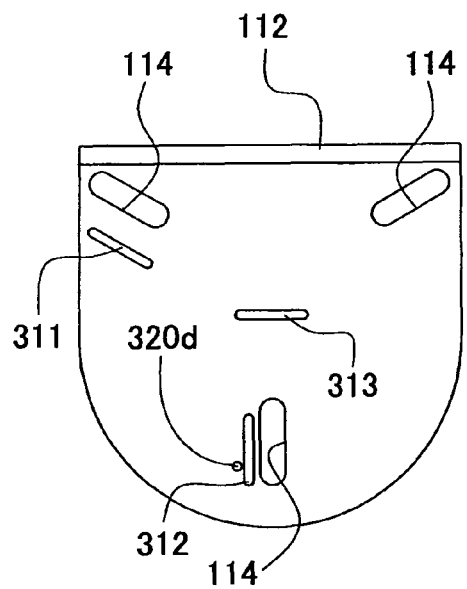
FIG. 16D is a plan view showing a bottom surface of the FOUP in the third embodiment in the state that information pad is provided corresponding to the identification pin in FIG. 15D.

FIG. 14 is a plan view corresponding to FIG. 6 in the third embodiment. As shown in FIG. 14, a conveyer system of the third embodiment has a structure wherein platforms 314a and 314b, platforms 342a and 342b, and two platforms 361 are provided in place of the platforms 14a and 14b, the platforms 42a and 42b, and the two platforms 61. And these are respectively at positions where the platforms 14a and 14b, the platforms 42a and 42b, and the two platforms 61 (see FIG. 1) are provided in the conveyer system 1 (see FIG. 1) of the first embodiment.

FIGS. 15A to 15D are plan views in which 361 provided corresponding to the platforms 314a and 314b of FIG. 14 is shown as being enlarged. FIGS. 16A to 16D are diagrams showing a bottom surface of the FOUP 110 according to the third embodiment. As shown in FIGS. 14 and 15A to 15D, the platform 314a is a substantially rectangular plate-like body in a plan view, on which a notch (first notch) 332a is formed. The notch 332a extends rightward toward the inside of the platform 314a from a lateral surface of the platform 314a facing to a platform 342a, i.e. the left lateral surface of the platform 314 in FIG. 14. Also, a right lateral surface of the notch 332a in FIG. 14 extends as being inclined leftward as approaching to a lower side in the upper end of FIG. 14, and a part positioned at the lower part from this part in FIG. 14 extends downward in FIG. 14.

The platform 314a has sensor pins (judgment units) 306 and 307 that are provided on an upper surface in the vicinity of a right upper end and a lower end in FIGS. 15A to 15D. The sensor pins 306 and 307 are biased upward by a spring (not shown) to project upward from the upper surface of the platform 314a, so that the sensor pins 306 and 307 are pushed down into the inside of the platform 314a when pressed from above.

Sensor pads 311 and 312 are provided at positions overlapping with the sensor pins 306 and 307 in a plan view on the bottom surface of the FOUP 110 as shown in FIGS. 16A to 16D. When the FOUP 110 is placed on the platform 314a, the sensor pins 306 and 307 are pressed from above by the sensor pads 311 and 312 to be pushed down into the inside of the platform 314a. With such constitution, it is possible to detect whether or not the FOUP 110 is placed on the platform 314a by whether or not the sensor pins 306 and 307 are pushed down.

The positions of the sensor pads 311 and 312 in the FOUP 110 are decided by a standard, and the sensor pads 311 and 312 extend over the platform 314a and the platform 316 in a plan view in a state where the FOUP 110 is placed on the platform 314a and the platform 361 is inside the notch 332a and at a height identical with that of the platform 314a. Therefore, it is possible to provide the same sensor pins on an upper surface of the platform 361 in place of the sensor pins 306 and 307.

However, in this case, though it is possible to judge whether or not the FOUP 110 is placed on the platform 314a in the case where the platform 361 is at the position shown in FIGS. 15A to 15D, it is impossible to judge whether or not the FOUP 110 is placed on the platform 314a in the case where the platform 361 is moved to another position as described later in this specification.

In contrast, since the sensor pins 306 and 307 are provided on the upper surface of the platform 314a in this embodiment, it is possible to judge whether or not the FOUP 110 is placed on the platform 314a irrespective of the position of the platform 361.

Also, three positioning pins 33 that are the same as those of the first embodiment are provided on the upper surface of the platform 314a. Further, two holes 303 and 304 are provided on the upper surface of the platform 314a at an upper end in FIGS. 15A to 15D. It is possible to attach an identification pin 310 to the holes 303 and 304 as described later in this specification.

The platform 314b is so disposed as to be symmetrical with the platform 314a with respect to the horizontal direction of FIG. 14. The platform 314b is provided with a notch (first notch) 332b, sensor pins 306 and 307, positioning pins 33, and holes 303 and 304 in the same manner as in the platform 314a, and these components have the same structures as those of the notch 332a, the sensor pins 306 and 307, the positioning pins 33, and the holes 303 and 304 of the above-described platform 314a. The positions of the notch 332b, the sensor pins 306 and 307, the positioning pins 33, and the holes 303 and 304 in the platform 314b are symmetrical with the notch 332a, the sensor pins 306 and 307, the positioning pins 33, and the holes 303 and 304 of the platform 314a with respect to the horizontal direction of FIG. 14.

The platforms 342a and 342b are substantially rectangular plate-like bodies in a plan view, on which notches (second notch) 352a and 352b are formed. The notches 352a and 352b are symmetrical with the notches 332a and 332b with respect to the horizontal direction of FIG. 14. Three positioning pins 53 that are the same as those of the first embodiment are provided on upper surfaces of each of the platform 342a and 342b.

The platform 361 is a plate-like body having a symmetrical shape with respect to the horizontal direction of FIG. 14 so that a substantially right half in FIG. 14 is along a rim of the notch 332a in a plan view and a substantially left half is along a rim of the notch 332b. Also, the platform 361 is moved by the elevation device 62 in the vertical direction, which is the direction orthogonal to the drawing sheet of FIG. 14, as passing through the notches 332a and 332b, and in the horizontal direction along the guide 64 by the moving device 63 in the same manner as in the first embodiment.

A sensor pin 308 is provided at a substantially central part of an upper surface of the platform 361. The sensor pin 308 is biased upward by a spring (not shown) to project upward from the upper surface of the platform 361, so that the sensor pin 308 is pushed down into the inside of the platform 361 when pressed from above.

A sensor pad 313 extending in the horizontal direction in FIGS. 16A to 16D is provided at a substantially central part of the bottom surface of the FOUP 110 as shown in FIGS. 16A to 16D. When the FOUP 110 is placed on the platform 361, the sensor pin 308 is pressed from above by the sensor pad 313 to be pushed down into the inside of the platform 361. With such constitution, it is possible to detect whether or not the FOUP 110 is placed on the platform 361 by whether or not the sensor pin 308 is pushed down into the platform 361.

Further, two holes 301 and 302 are provided on the upper surface of the platform 361 in a lower end in FIGS. 15A to 15D and symmetrically to each other with respect to the horizontal direction of FIGS. 15A to 15D. In a state where the platform 361 overlaps with the notch 332a in a plan view and is at a height identical with that of the platform 314a, the holes 301 and 302 and the above-described holes 303 and 304 have a positional relationship indicated in FIGS. 15A to 15D. The identification pin 310 is attached to any one of the holes 301 to 304 in such a fashion that is shown in FIGS. 15A to 15D. The hole 301, 302, 303, or 304 to which the identification pin 310 is attached is filled in with black in FIGS. 15A to 15D.

On a bottom surface of FOUP 110, in a state of being placed on the platform 314a as shown in FIGS. 15A to 15D, an information pad 320a, 320b, 320c, or 320d is provided at a position overlapping with any one of the holes 301 to 304 and corresponding to the types of the FOUP 110 such as the number of semiconductor substrates P (see FIG. 4) housed in the FOUP 110 and the shape of the FOUP 110. The information pads 320a to 320d are holes extending upward from the bottom surface of the FOUP 110.

With such constitution, (1) in the case where the identification pin 310 is attached to the hole 301 and the information pad 320a is provided, (2) in the case where the identification pin 310 is attached to the hole 302 and the information pad 320b is provided, (3) in the case where the identification pin 310 is attached to the hole 303 and the information pad 320c is provided, or (4) in the case where the identification pin 310 is attached to the hole 304 and the information pad 320d is provided, the identification pin 310 is fitted into the information pad 320a, 320b, 320c, or 320d when the FOUP 110 is placed on the platform 314a, and the FOUP 110 is placed on the platform 314a in such a fashion that the bottom surface is horizontal.

However, in the cases other than the above-described four cases, when the FOUP 110 is placed on the platform 314a, the identification pin 310 is not fitted into the information pads 320a to 320d, and the bottom surface of the FOUP 110 contacts the identification pin 310, so that the FOUP 110 is placed on the platform 314a with the bottom surface being inclined from the horizontal direction.

Therefore, when the identification pin 310 is attached to any one of the holes 301 to 304 of the platform 314a corresponding to the information pads 320a to 320d of the FOUP 110 to be placed on the platform 314a, it is possible to judge Whether or not an appropriate FOUP 110 is placed on the platform 314a by whether or not the bottom surface of the FOUP 110 placed on the platform 314a is horizontal or not. The holes 301 and 302 and the identification pins 310 attached to the hole 301 or 302 correspond to the second identification unit according to this invention, and the holes 303 and 304 and the identification pin 310 attached to the holes 303 and 304 correspond to the first identification unit according to this invention. The holes 301 to 304 and the identification pins 310 correspond to the identification unit according to this invention.

The positions of the information pads 320a to 320d and the positions of the holes 301 to 304 corresponding to the information pads 320a to 320d shown in FIGS. 16A to 16D are decided by a standard. In the conventional platform without the notch 332a, all of the holes 301 to 304, are disposed on an upper surface thereof. However, since the notch 332a is formed in the platform 314a in this embodiment, it is difficult to dispose all the holes 301 to 304 on the upper surface of the platform 314a.

Accordingly, in this embodiment, the holes 303 and 304 are disposed on the platform 314a, and the holes 301 and 302 are disposed on the platform 361, so that the holes 301 to 304 establish the above-described positional relationship when the platform 361 overlaps with the notch 332a in a plan view and is at a height identical with that of the platform 314a. With such constitution, it is possible to form the holes 301 to 304 in accordance with the standard even in the case where the notch 332a is provided in the platform 314a.

Also, in the case where the platform 361 overlaps with the notch 332b and is at a height identical with that of the platform 314b, a positional relationship between the holes 301 and 302 provided on the platform 361 and the holes 303 and 304 provided on the platform 314b is the same as that shown in FIGS. 15A to 15D. Therefore, in the case where the holes 303 and 304 are provided on the platform 314b, the holes 301 and 302 are provided on the platform 361, and the platform 361 overlaps with the notch 332a in a plan view and is at a height identical with that of the platform 314b, the holes 301 to 304 establish the above-described positional relationship. With such constitution, it is possible to form the holes 301 to 304 in accordance with the standard even when the notch 332b is provided on the platform 314b.

Hereinafter procedures for placing the FOUPs 110 on the platforms 314a and 314b will be described. Note that only the method for placing the FOUP 110 on the platform 314a will be described since the method for placing the FOUP 110 on the platform 314a and the method for placing the FOUP 110 on the platform 314b are the same except that the directions of transfers of the platform 361 with respect to the horizontal direction in FIG. 14 by the moving device 63 are reverse to each other.

Figure 17A:
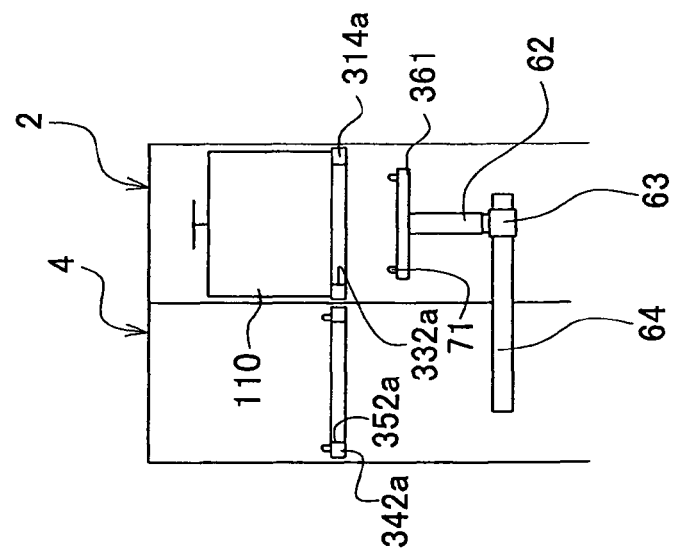
FIG. 17A is a diagram showing a step of a procedure of placing the FOUP on the platform in the third embodiment.
Figure 17B:
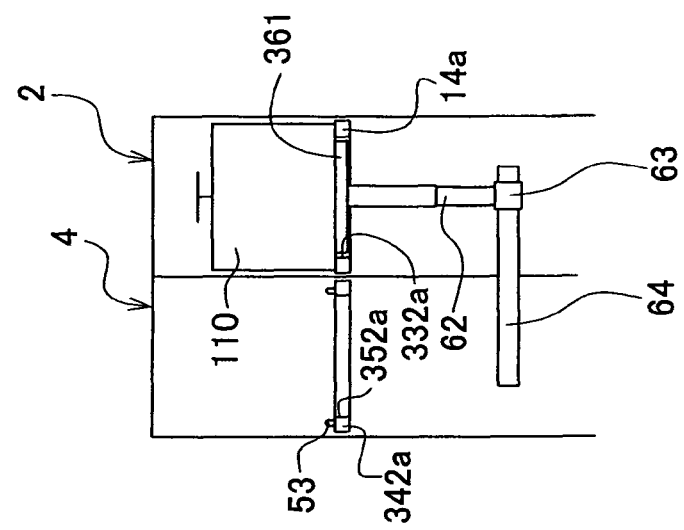
FIG. 17B is a diagram showing a step of a procedure of placing the FOUP on the platform in the third embodiment next to the step of FIG. 17A.
Figure 17C:
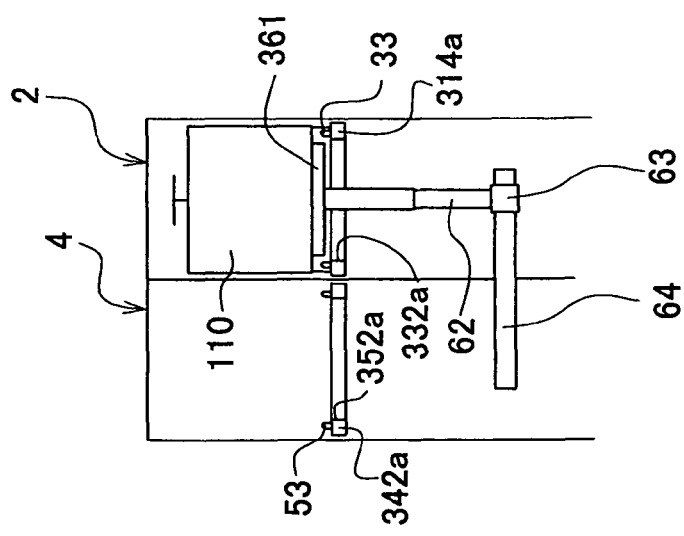
FIG. 17C is a diagram showing a step of a procedure of placing the FOUP on the platform in the third embodiment next to the step of FIG. 17B.

FIGS. 17A to 17C are diagrams showing a part of the procedure for placing the FOUP 110 on the platform 314a in this embodiment. FIG. 17A is a diagram corresponding to FIG. 8C in the third embodiment, and the procedure for achieving the state of FIG. 17A is omitted below since the procedure is the same as that of the first embodiment (see FIGS. 8A to 8C).

In the state shown in FIG. 17A, the FOUP 110 is placed on the upper surface of the platform 361, and the platform 361 is position above the platform 314a. From this state, the platform 361 is lowered to a height identical with that of the platform 314a by the elevation device 62 as shown in FIG. 17B. In this state, the FOUP 110 is placed over the platforms 314a and 361. Since the holes 301 to 304 are positioned with the positional relationship defined by the standard in this state as described above, it is possible to judge whether or not the appropriate FOUP 110 is placed on the platform 314a by whether or not the bottom surface of the FOUP 110 placed on the platforms 314a and 361 is horizontal.

After that, the platform 361 is lowered further by the elevation device 62, so that the FOUP 110 is placed on the platform 314a and removed from the platform 361 as shown in FIG. 17C.

In the case where it is judged that the appropriate FOUP 110 is placed on the platform 314a, semiconductor substrates P (see FIG. 4) housed in the FOUP 110 are conveyed to the isolated space 102 from the load port 2, and processing is performed on the semiconductor substrates P by the semiconductor production device 101, followed by housing the semiconductor substrates P after the processing in the FOUP 110 in the same manner as in the first embodiment. The FOUP 110 is conveyed to the next process step by the OHT conveyer vehicle 130 (see FIGS. 8A to 8D) in the same manner as in the first embodiment.

In the case where it is judged that the appropriate FOUP 110 is not placed on the platform 314a, the above processing is not performed, and the FOUP 110 is immediately conveyed to the next process step by the OHT conveyer vehicle 130.

According to the third embodiment described above, the following effects are achieved.

In the load port, it is required to provide the holes 301 to 304 for attaching thereto the identification pins 310 for identifying the types of the FOUP 110 placed on the platforms 314a and 314b in accordance with the information pads 320a to 320d disposed at the positions decided by the predetermined standard on the bottom surface of the FOUP 110. However, since the notches 332a and 332b are formed in the platforms 314a and 314b, it is impossible to provide all of the holes 301 to 304 on the platforms 314a and 314b. Accordingly, in the third embodiment, the holes 303 and 304 are provided on the platforms 314a and 314b, and the holes 301 and 302 are provided on the platform 361, so that the holes 301 to 304 are provided at the positions decided by the predetermined standard in a state where the platform 361 overlaps with the notches 332a and 332b and disposed at the height identical with that of the platforms 314a and 314b.

The sensor pins 306 and 307 for sensing whether nor not the FOUP 110 is placed on the platforms 314a and 314b are provided on the platforms 314a and 314b, and it is therefore possible to judge whether or not the FOUP 110 is placed on the platforms 314a and 314b irrespective of the position of the platform 361, unlike the case of providing the sensor pins 306 and 307 on the platform 361.

The effects same as those of the first embodiment are also achieved by the third embodiment.

Hereinafter, modifications of the third embodiment will be described. Parts having structures same as those of the third embodiment are denoted by the same reference numerals, and descriptions thereof are omitted as required.

Figure 18:
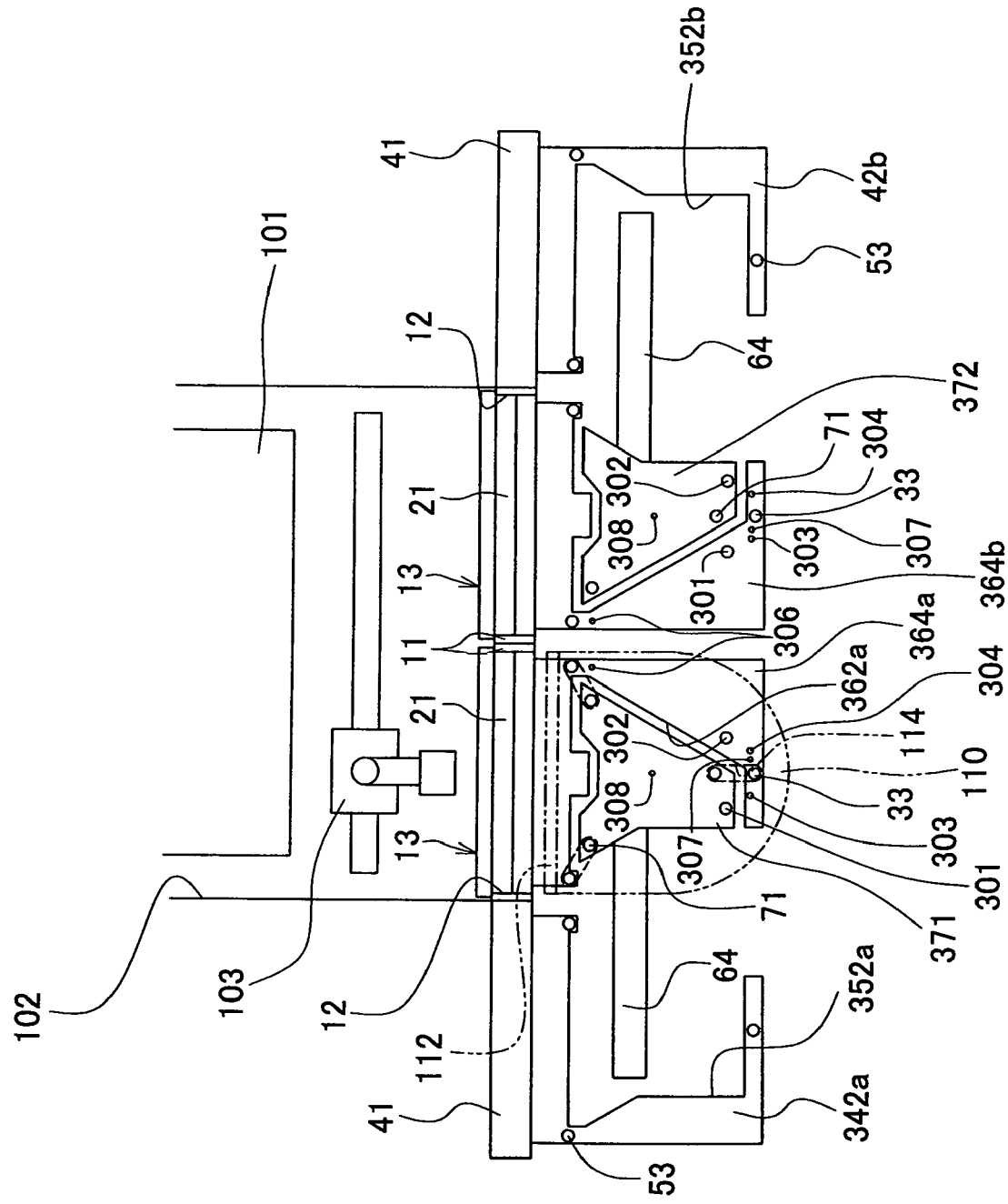
FIG. 18 is a plan view showing the third modification, which corresponds to FIG. 14.

In a third modification, a right end of the notch 362a of a platform 364a in FIG. 18 extends as being inclined in such a fashion as to be positioned at the left part as approaching to the lower part of FIG. 18. Also, a platform 371 has such a shape that a right end thereof in FIG. 18 extends along the platform 364a and a left end in FIG. 18 has substantially the same shape as that of the platform 361 (see FIG. 14). Only the hole 301 among the holes 301 to 304 is provided on the platform 371, and the holes 302 to 304 are provided on the platform 364a.

A left end of the notch 362b of a platform 364b in FIG. 18 extends as being inclined in such a fashion as to be positioned at the right part as approaching to the lower part of FIG. 18. Also, a platform 372 has such a shape that a left end thereof in FIG. 18 extends along the platform 364a and a right end in FIG. 18 has substantially the same shape as that of the platform 361 (see FIG. 14). Only the hole 301 among the holes 301 to 304 is provided on the platform 371, and the holes 302 to 304 are provided on the platform 364a.

In this case, too, the holes 301 to 304 establish the positional relationship decided by the standard in a state where the platform 371 overlaps with the notch 362a and is at a height identical with that of the platform 364a and in a state where the platform 372 overlaps with the notch 362b and is at a height identical with that of the platform 364b.

Also, the holes 303 and 304 that are provided on the platforms 314a and 314b may be provided on the platforms 342a and 342b in the third embodiment. In this case, the holes 301 and 302 provided on the platform 361 and the holes provided on the platforms 342a and 342b are disposed so as to establish the positional relationship decided in accordance with the standard. Therefore, when the identification pin 310 is attached to any one of the holes, it is possible to judge whether or not the appropriate FOUP 110 is placed on the platforms 342a and 342b by whether or not the bottom surface of the FOUP 110 placed on the platforms 342a and 342b is horizontal in the same manner as in the third embodiment in a state where the platform 361 is inside the notches 352a and 352b and is at the height identical with that of the platforms 342a and 342b.

Though the sensor pins 306 and 307 are provided on the sensor pad platforms 314a and 314b and the sensor pin 308 is provided on the platform 361 in the third embodiment, these are one example of the positions of the sensor pins decided by the standard, i.e. the positions and the number of the sensor pins are not limited to those of the third embodiment, and the sensor pins may be provided at other positions of the platforms 314a and 314b and the platform 361 corresponding to the standard, while providing the sensor pads on the positions corresponding to the sensor pins on the bottom surface of the FOUP 110.

Sensor pins that are the same as the sensor pins 306 and 307 may be provided on the platforms 342a and 342b. In this case, it is possible to judge whether or not the FOUP 110 is placed on the platforms 342a and 342b by whether or not the sensor pins are pushed down into the platforms 342a and 342b as being pressed by the sensor pads of the FOUP 110.

The modification of the first embodiment is applicable to the third embodiment.

Fourth Embodiment

Hereinafter, a fourth embodiment according to this invention will be described. Note that since only a part of the fourth embodiment is different from the first embodiment, the part that is different from the first embodiment will be described, and descriptions on the parts same as the first embodiment will be omitted as required.

Figure 19:
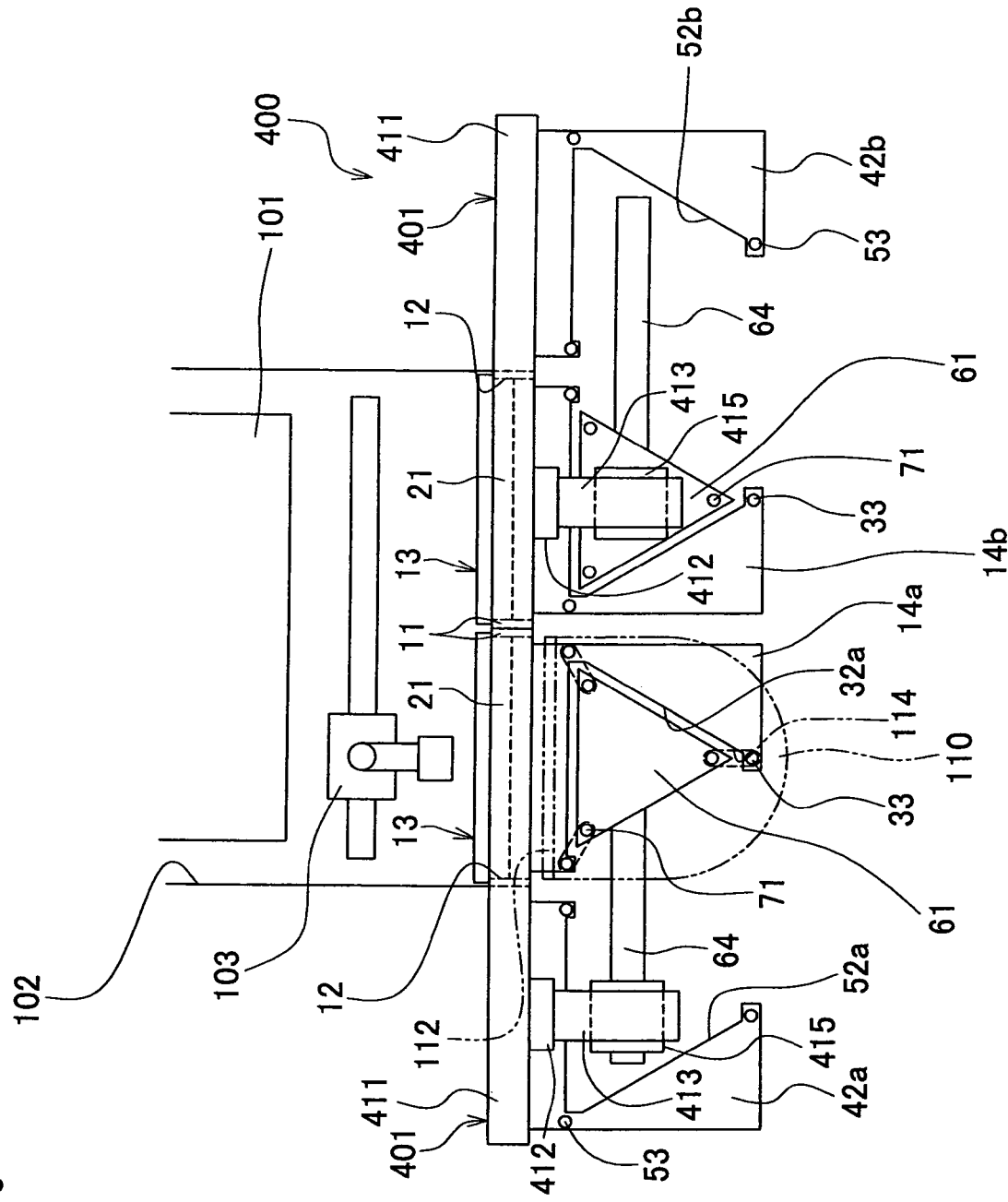
FIG. 19 is a plan view corresponding to FIG. 6 in a fourth embodiment.
Figure 20:
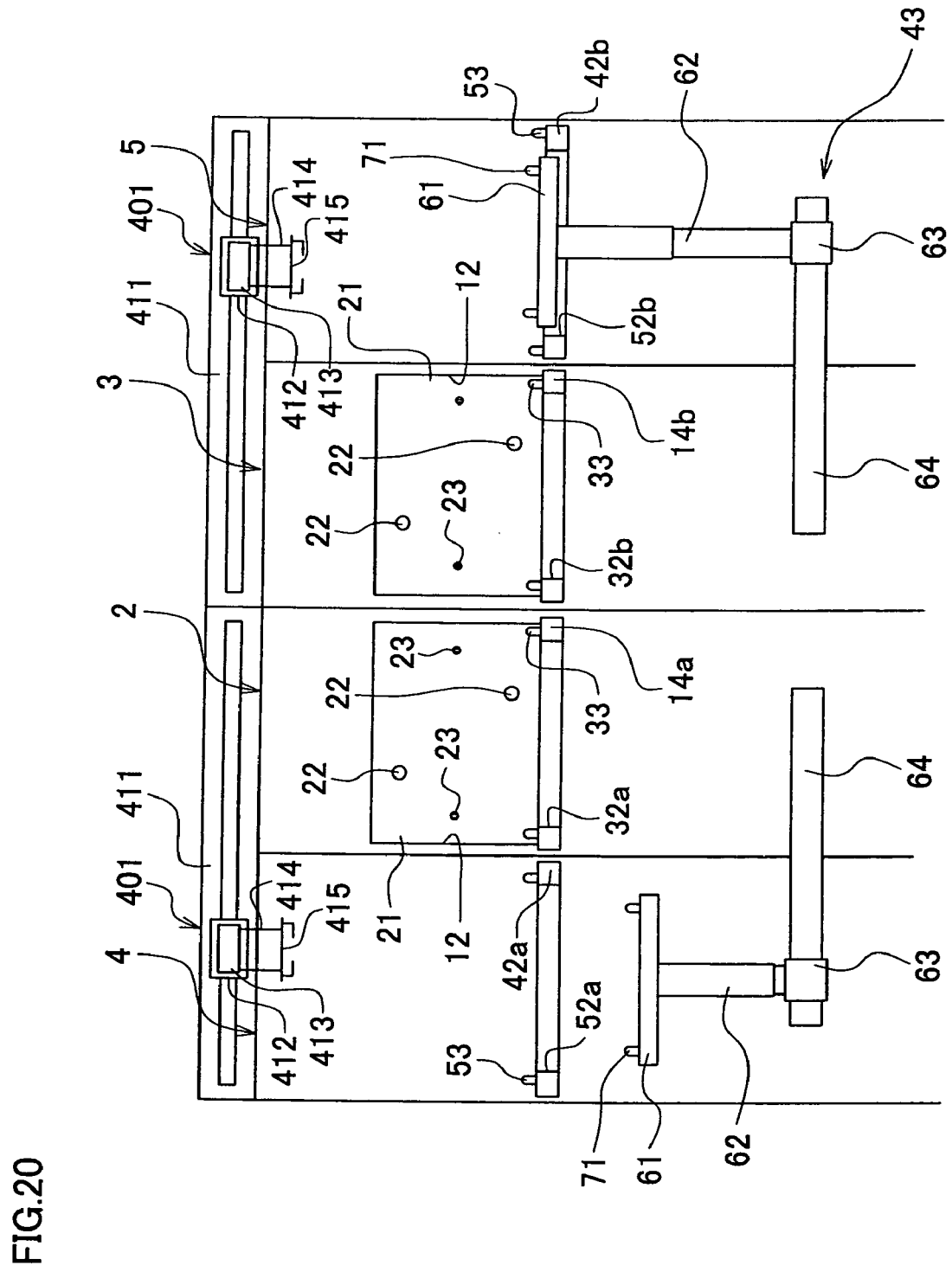
FIG. 20 is a front view corresponding to FIG. 7 in the fourth embodiment.

FIG. 19 is a plan view showing the fourth embodiment, which corresponds to FIG. 6. FIG. 20 is a front view showing the fourth embodiment, which corresponds to FIG. 7. As shown in FIGS. 19 and 20, a conveyer system 400 of the fourth embodiment is obtainable by adding two conveyer devices (third conveyer device) 401 to the structure of the conveyer system 1 (see FIG. 1) of the first embodiment.

Each of the two conveyer devices 401 is provided with a rail 411, a moving device 412, an arm 413, an elevation wire 414, and a gripper (carrier gripping unit) 415. The rails 411 are disposed over upper surfaces of the load port 2 and the relay unit 4 and upper surfaces of the load port 3 and the relay unit 5 respectively, and each of the rails 411 extends in the horizontal direction of FIG. 19.

The moving device 412 is engaged with the rail 411 and moves in the horizontal direction of FIG. 19 along the rail 411 to move the arm 413, the elevation wire 414, and the gripper 415 in the horizontal direction of FIG. 19. The arm 413 extends downward in FIG. 19 from an end of the moving device 412 opposite to the rail 411, i.e. from the front end of the moving device 412 which is positioned at the lower end in FIG. 20. The elevation wire 414 extends downward in FIG. 20 from the arm 413 at the lower end in FIG. 19. The elevation wire 414 moves the gripper 415 that is attached to a lower end thereof in the vertical direction. The moving device 412 and the elevation wire 414 correspond to the third moving unit according to this invention.

The gripper 415 is attached to the lower end of the elevation wire 414 and structured to grip the flange 113 provided at the upper end of the FOUP 110. It is possible to suspend the FOUP 110 by elevating the gripper 415 by the elevation wire 414 in a state where the gripper 415 grips the FOUP 110.

Hereinafter, operations of replacing the FOUPs 110 to be placed on the platforms 14a and 14b in the fourth embodiment will be described. However, since the operation of replacing the FOUPS 110 to be placed on the platforms 14a and 14b are the same except that a direction of movement of the platform 61 by the moving device 63 and a direction of movement of the gripper 415 by the moving device 412 are reverse to each other with respect to the horizontal direction of FIG. 20, only the operation of replacing the FOUPs 110 to be placed on the platform 14a will be described below.

Figure 21A:
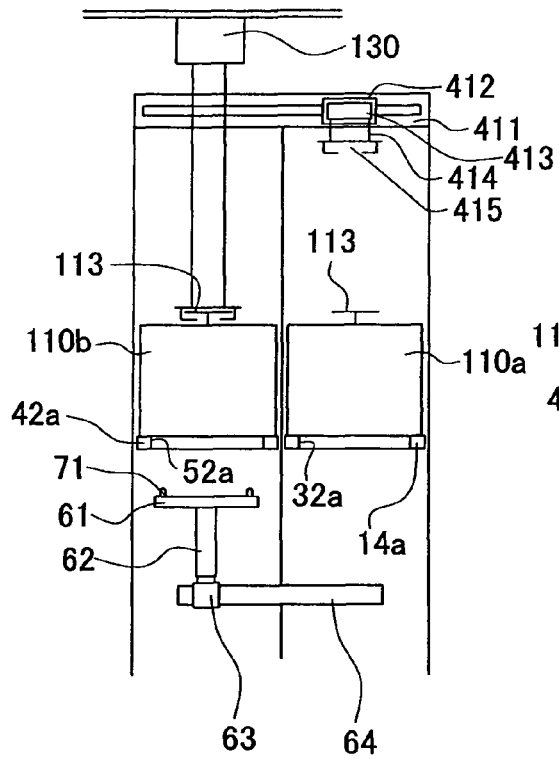
FIG. 21A is a diagram showing a step of an operation of replacing FOUPs in the fourth embodiment.

FIGS. 21A to 21 D are diagrams showing the operation of the FOUPs 110 to be placed on the platform 14a. In order to make it easy to understand the description in FIG. 21, the FOUP 110 placed on the platform 14a before the replacement of the FOUPs 110 is denoted as FOUP 110a, and the FOUP 110 to be placed on the platform 14a by the replacement is denoted as FOUP 110b.

In order to replace the FOUP 110a placed on the platform 14a with the FOUP 110b, the FOUP 110b is placed on the platform 42a by the OHT conveyer vehicle 130 as shown in FIG. 21A. In this case, the moving device 412 is at a position overlapping with the platform 14a, i.e. at a position not overlapping with the platform 42a, so that the FOUP 110b does not contact the moving device 412, the arm 413, the elevation wire 414, and the gripper 415.

Figure 21B:
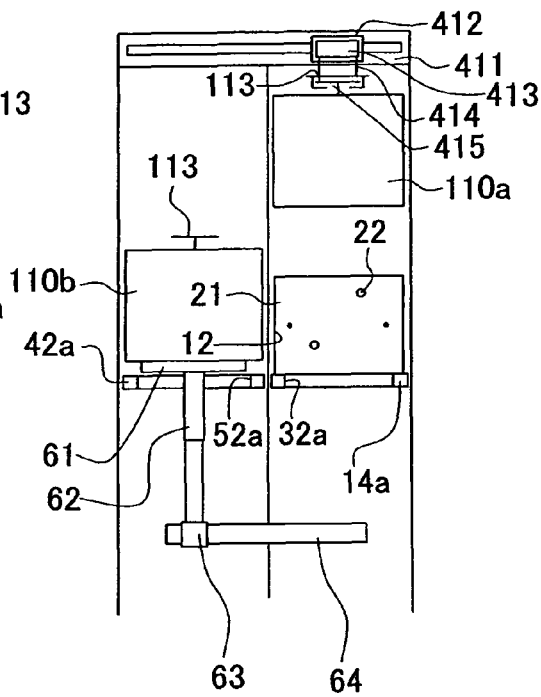
FIG. 21B is a diagram showing a step of an operation of replacing FOUPs in the fourth embodiment next to the step of FIG. 21A.

Subsequently, the platform 61 is moved to a position facing to the platform 42a by the moving device 63, and the platform 61 is elevated above the platform 42a by the elevation device 62 as shown in FIG. 21B. Thus, the FOUP 110b is transferred from the platform 42a to the platform 61.

At the same time, by lowering the gripper 415 by the elevation wire 414 and by elevating the gripper 415 by the elevation wire 414 again after gripping the flange 113 of the FOUP 110a by the gripper 415 as shown in FIG. 21B, the FOUP 110 is suspended, and the FOUP 110a is moved so that a bottom surface of the FOUP 110a is at a position higher than an upper end of the FOUP 110b placed on the platform 61.

Figure 21C:
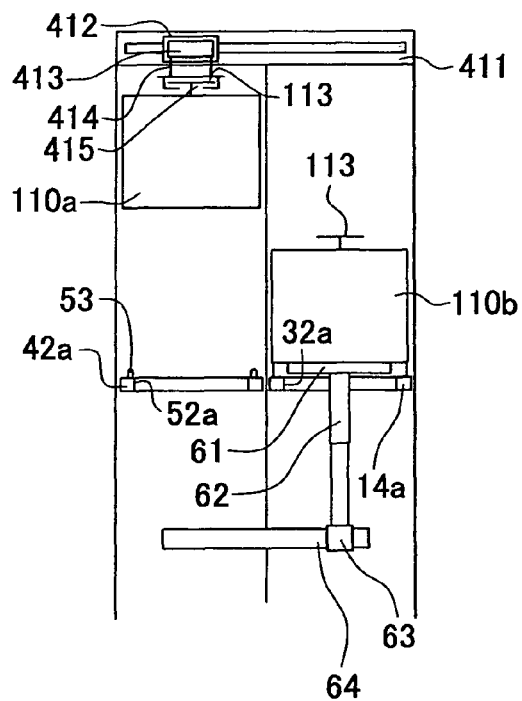
FIG. 21C is a diagram showing a step of an operation of replacing FOUPs in the fourth embodiment next to the step of FIG. 21B.

Subsequently, as shown in FIG. 21C, the platform 61 is moved rightward in FIG. 21C to a position facing to the platform 14a by the moving device 63, and the moving device 412 is moved leftward in FIG. 21C to a position facing to the platform 42a.

Figure 21D:
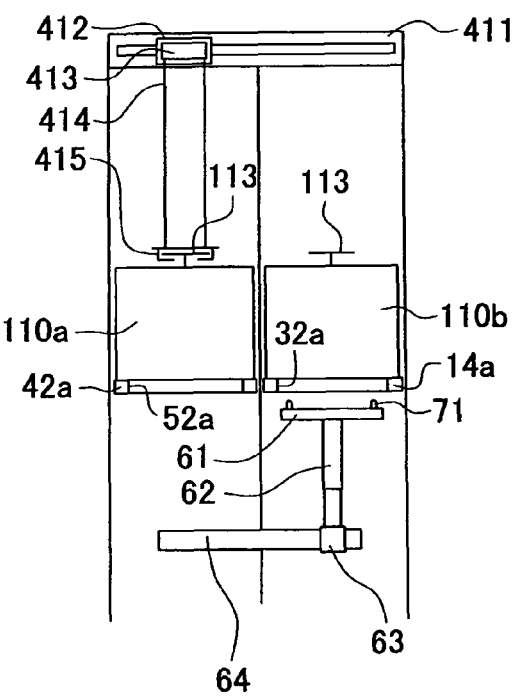
FIG. 21D is a diagram showing a step of an operation of replacing FOUPs in the fourth embodiment next to the step of FIG. 21C.

Subsequently, as shown in FIG. 21D, the platform 61 is lowered below the platform 14a by the elevation device 62, and the gripper 415 is lowered by the elevation wire 414 so that the bottom surface of the FOUP 110a contacts the platform 42a and the gripping of the flange 113 by the gripper 415 is released. Thus, the FOUP 110b is placed on the platform 14a simultaneously with the placement the FOUP 110a on the platform 42a.

After that, the moving device 412 is moved to the position indicated in FIG. 21A, and the FOUP 110a placed on the platform 42a is conveyed to the next process step by the OHT conveyer vehicle 130. Hereafter, the same operation is repeated to replace FOUPs 110 to be sequentially placed on the platform 14a.

According to the above-described fourth embodiment, it is possible to easily replace the FOUPs 110 to be placed on the platforms 14a and 14b by conveying the FOUP 110b from the platform 42a and 42b to the platforms 14a and 14b by the conveyer device 43 and by conveying the FOUP 110a from the platforms 14a and 14b to the platforms 42a and 42b by the conveyer device 401.

Effects same as those of the first embodiment are also achieved by the fourth embodiment.

Hereinafter, modifications of the fourth embodiment will be described.

Figure 22A:
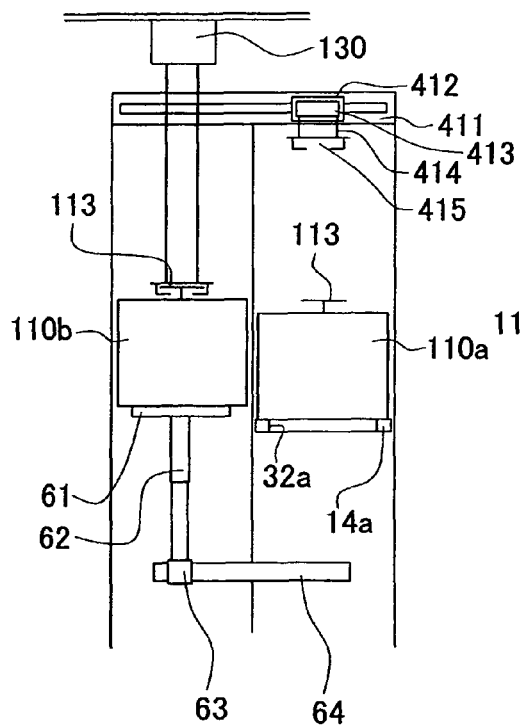
FIG. 22A is a diagram showing a step of the fourth modification, which corresponds to FIG. 21A.

In a fourth modification, the platforms 42a and 42b are not provided as shown in FIGS. 22A to 22D. In this case, the platform 61 is moved to the position facing to the position at which the platform 42a is disposed in the fourth embodiment (see FIG. 21) by the moving device 63 and elevated to a position higher than the platform 14a by the elevation device 62, and the FOUP 110b is placed on the platform 61 in this state by the OHT conveyer vehicle 130 as shown in FIG. 22A.

Figure 22B:
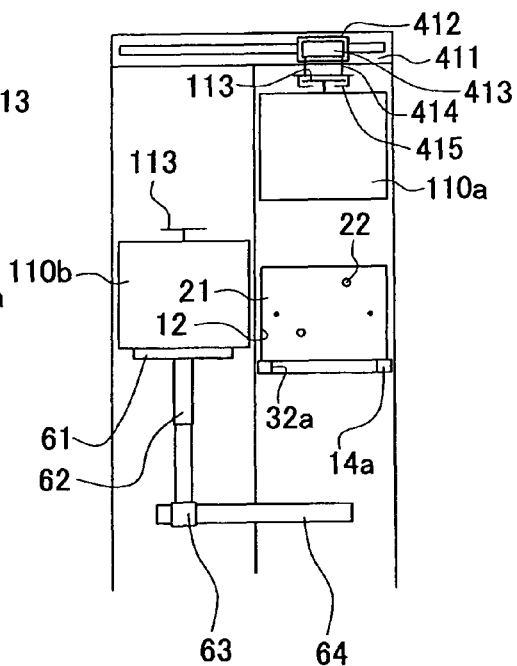
FIG. 22B is a diagram showing a step of the fourth modification, which corresponds to FIG. 21B.

Subsequently, as shown in FIG. 22B, after the gripper 415 is lowered by the elevation wire 414 to cause the gripper 415 to grip the FOUP 110a, the elevation wire 414 is elevated again to suspend the FOUP 110a by the gripper 415, and the FOUP 110a is so moved that a bottom surface of the FOUP 110a is above an upper end of the FOUP 110b.

Figure 22C:
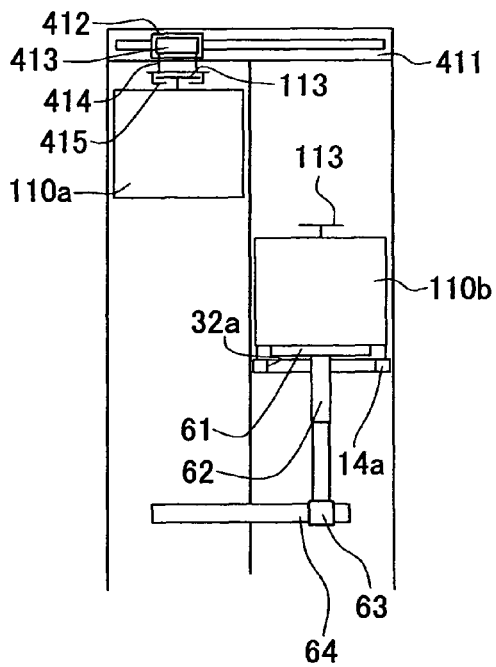
FIG. 22C is a diagram showing a step of the fourth modification, which corresponds to FIG. 21C.

Subsequently, as shown in FIG. 22C, the platform 61 is moved rightward in FIG. 22C to a position facing to the platform 14a by the moving device 63, and the gripper 415 is moved leftward in FIG. 22C to a position facing to the position at which the platform 42a is disposed in the fourth embodiment (see FIG. 21) by the moving device 412.

Figure 22D:
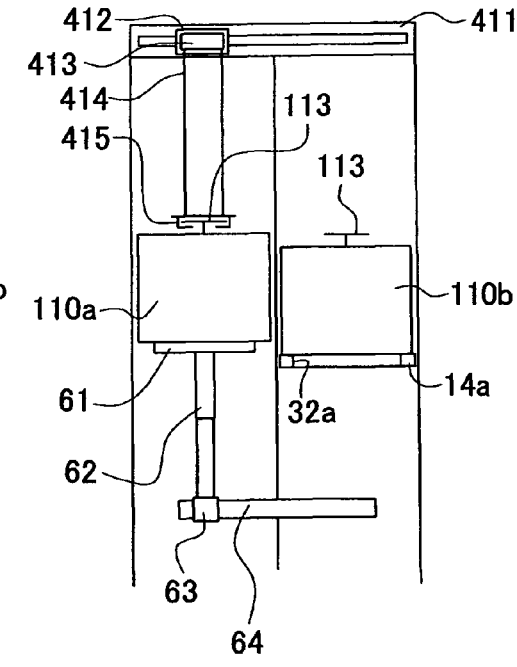
FIG. 22D is a diagram showing a step of the fourth modification, which corresponds to FIG. 21D.

Subsequently, as shown in FIG. 22D, after placing the FOUP 110b on the platform 14a by lowering the platform 61 lower than the platform 14a by the elevation device 62, the platform 61 is moved leftward in FIG. 22D to a position facing to the gripper 415 by the moving device 63. The platform 61 is elevated by the elevation device 62 to a position same as that of FIG. 22A, and the gripper 415 is lowered by the elevation wire 414 so that the FOUP 110a contacts the upper surface of the platform 61. In this state, the gripping of the FOUP 110a by the gripper 415 is released to place the FOUP 110a on the platform 61.

After that, the FOUP 110a placed on the platform 61 is conveyed to the next process step by the OHT conveyer vehicle 130, and the same operation is repeated hereafter. Since only the direction of movement with respect to the horizontal direction of FIGS. 22A to 22D are reversed from that of the above-described operation in the operation of replacing the FOUPs 110 to be placed on the platform 14b, description for the operation is omitted.

Though the FOUP 110b is conveyed from the platforms 42a and 42b to the platforms 14a and 14b by the conveyer device 43 and the FOUP 110a is conveyed from the platforms 14a and 14b to the platforms 42a and 42b by the conveyer device 401 in the fourth embodiment, the FOUP 110a may be conveyed from the platforms 14a and 14b to the platforms 42a and 42b by the conveyer device 43 and the FOUP 110b is conveyed from the platforms 42a and 42b to the platforms 14a and 14b by the conveyer device 401 in reverse to the above.

Though the conveyer device 401 is formed of the rails 411, the moving device 412, the arm 413, the elevation wire 414, and the gripper 415 in the fourth embodiment, this is not limitative, and another mechanism capable of conveying the FOUP 110a in the vertical direction and conveying in the horizontal direction between the platforms 14a and 42a and between the platforms 14b and 42b may be provided in place of the conveyer device 401.

Modifications same as those of the first embodiments may be made in the forth embodiment, too.

The invention claimed is:

1. A conveyer system comprising:
a load port having a first platform on whose upper surface a carrier for conveying a semiconductor substrate may be placed and providing communication between an isolated space isolated from outside, in which a semiconductor production device performing processing for semiconductor production on the semiconductor substrate may be disposed, and a housing space provided inside the carrier placed on the first platform and housing the semiconductor substrate, wherein the first platform has a first notch extending into the first platform and opening at one lateral surface of the first platform,
a relay unit disposed adjacent to the first platform relative to the horizontal direction and having a third platform on whose upper surface the carrier may be temporarily placed, wherein the third platform has a second notch having an opening horizontally facing the opening of the first notch, and which extends into the third platform from a lateral surface of the third platform horizontally facing the one lateral surface of the first platform, and
a first conveyer device disposed below the first platform and the third platform, the first conveyor device having a second platform on whose upper surface the carrier is to be placed, and a first moving unit for moving the second platform in a vertical direction and in a horizontal direction,
wherein the second platform is movable by the first conveyor device in the vertical direction while passing through the first notch, and is also movable by the first conveyor device in the horizontal direction between the first platform and the third platform by passing horizontally between the horizontally facing openings of the first notch and the second notch.

2. The conveyer system according to claim 1, wherein the relay unit has the first conveyer device.

3. The conveyer system according to claim 1 or 2, wherein the first platform, the second platform, and the third platform have positioning units for positioning the carrier.

4. The conveyer system according to claim 1 or 2, wherein the second platform further comprises a first fixing unit for fixing the carrier placed on the second platform.

5. The conveyer system according to claim 1 or 2, further comprising a plurality of identification units for identifying a type of the carrier placed on the first platform, wherein
the plurality of identification units comprise
a first identification unit provided on the first platform and
a second identification unit provided on the second platform, and
the first identification unit and the second identification unit are disposed at positions corresponding to a predetermined standard and enabling to identify the type of the carrier placed on the first platform in a state where the second platform overlaps with the first notch and is at a height identical with that of the first platform.

6. The conveyer system according to claim 1 or 2, wherein the first platform is provided with a judgment unit for judging whether or not the carrier is placed on the first platform.

7. The conveyer system according to claim 1 or 2, further comprising a second conveyer device for conveying the carrier between the first platform and a predetermined second position that is above the first platform, wherein
the second conveyer device comprises
a fourth platform having a shape substantially identical with that of the second platform and
a second moving unit for moving the fourth platform in the vertical direction.

8. The conveyer system according to claim 7, wherein the fourth platform further comprises a second fixing unit for fixing the carrier placed on the fourth platform.

9. The conveyer system according to claim 1 or 2, further comprising a third conveyer device for conveying a carrier between the first platform and the third platform, the third conveyer device being different from the first conveyer device, wherein
the third conveyer device comprises
a carrier gripping unit capable of suspending the carrier by gripping an upper end of the carrier and
a third moving unit for moving the carrier gripping unit in the vertical direction, and in the horizontal direction between the first platform and the third platform.

* * * * *